US012755941B2

(12) United States Patent
Nogami et al.

(10) Patent No.: US 12,755,941 B2
(45) Date of Patent: Oct. 6, 2026

(54) MODIFICATION METHOD AND MODIFICATION DEVICE

(71) Applicant: Tokyo Electron Limited, Tokyo (JP)

(72) Inventors: Takafumi Nogami, Nirasaki (JP); Kenichi Kote, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 16 days.

(21) Appl. No.: 18/947,903

(22) Filed: Nov. 14, 2024

(65) Prior Publication Data

US 2025/0069854 A1 Feb. 27, 2025

Related U.S. Application Data

(63) Continuation of application No. PCT/JP2023/017272, filed on May 8, 2023.

(30) Foreign Application Priority Data

May 20, 2022 (JP) ................................ 2022-082818

(51) Int. Cl.
*H01J 37/32* (2006.01)

(52) U.S. Cl.
CPC .. *H01J 37/32266* (2013.01); *H01J 37/32201* (2013.01); *H01J 37/32302* (2013.01)

(58) Field of Classification Search
CPC ............ H01J 37/32192; H01J 37/3244; H01J 37/3222; H01J 37/32357; H01J 2237/334; H01J 37/32449; H01J 37/32935; H01J 37/32238; H01J 37/32229; H01J 37/32082; H01J 2237/3321
See application file for complete search history.

(56) References Cited

U.S. PATENT DOCUMENTS

2010/0243607 A1* 9/2010 Ohse ................ H01J 37/32146 156/345.28
2011/0223750 A1* 9/2011 Hayashi ............... H10P 50/283 438/758
2013/0029494 A1* 1/2013 Sasaki .................. H10P 50/283 438/724
2021/0043447 A1* 2/2021 Nozawa .............. H10P 14/6334
2022/0285129 A1* 9/2022 Sangle .............. H01J 37/32064
2024/0047179 A1* 2/2024 Kiyosue ............ H01J 37/32449

FOREIGN PATENT DOCUMENTS

JP 2008-085288 A 4/2008

* cited by examiner

*Primary Examiner* — Wei (Victor) Y Chan
(74) *Attorney, Agent, or Firm* — Nath, Goldberg & Meyer; Jerald L. Meyer

(57) ABSTRACT

A method of modifying a film formed on a substrate, includes: generating plasma by a microwave in an interior of a processing container in which a stage on which a substrate is placed is provided; and periodically applying a DC voltage to the stage in the interior of the processing container in which the plasma is generated by the generating the plasma, and irradiating the substrate with electrons in the plasma.

9 Claims, 18 Drawing Sheets

| | | Frequency (kHz) | | | | |
|---|---|---|---|---|---|---|
| | | 50 | 100 | 200 | 500 | 1000 |
| Duty (%) | 20 | 4 | 2 | 1 | 0.4 | 0.2 |
| | 50 | 10 | 5 | 2.5 | 1 | 0.5 |
| | 80 | 16 | 8 | 4 | 1.6 | 0.8 |
| | 90 | 18 | 9 | 4.5 | 1.8 | 0.9 |

Spin on SiNx

| split | Annealing | Order | Electron process | Order | VUV process | Order |
|---|---|---|---|---|---|---|
| 1 | | | Maximum conditions-10min | 1 | | |
| 2 | 450℃-N2-30min | 2 | Maximum conditions-10min | 1 | | |
| 3 | 450℃-N2-30min | 1 | Maximum conditions-10min | 2 | | |
| 4 | | | Maximum conditions-10min | 1 | Ar/N2 plsma-100Pa-100W-30min | 2 |
| 5 | 450℃-N2-30min | 2 | Gas species swing | 1 | | |
| 6 | 450℃-N2-30min | 2 | DC bias swing | 1 | | |

FIG. 14B

| | | | FT-IR | | | Leakage | XPS |
|---|---|---|---|---|---|---|---|
| | Thickness | RI | Si-H | Si-O | O/H | I-V | O conc [%] |
| Comparative example 1 (spin coating) | ~200 | 1.58 | - | - | - | - | ~15 |
| Comparative example 2 (spin coating + heat treatment) | - | <1.5 | - | - | - | - | ~50 |
| 1 | 114 | 1.64 | 1.3 | 0.3 | 0.2 | 2.00E-08 | 5.8 |
| 2 | 115 | 1.63 | 1.3 | 0.3 | 0.2 | 7.70E-08 | 8.7 |
| 3 | 109 | 1.63 | 1.2 | 0.3 | 0.3 | 2.80E-08 | 9.7 |
| 4 | 115 | 1.64 | 1.2 | 0.4 | 0.3 | 7.40E-08 | 9.2 |
| 5 | 114 | 1.62 | 1.2 | 0.4 | 0.3 | 2.00E-07 | 9.9 |
| 6 | 138 | 1.62 | 1.5 | 0.3 | 0.2 | 3.50E-08 | 11.2 |

MODIFICATION METHOD AND MODIFICATION DEVICE

CROSS-REFERENCE TO RELATED APPLICATIONS

This application is a bypass continuation application of international application No. PCT/JP2023/017272 having an international filing date of May 8, 2023 and designating the United States, the international application being based upon and claiming the benefit of priority from Japanese Patent Application No. 2022-082818, filed on May 20, 2022, the entire contents of which are incorporated herein by references.

TECHNICAL FIELD

The present disclosure relates to a modification method and a modification device.

BACKGROUND

Patent document 1 discloses a technique for applying a predetermined pulse voltage to a radio-frequency (RF) electrode, which is arranged inside a chamber and configured to hold a substrate, so as to be superimposed with an RF voltage, in a parallel plate type plasma processing apparatus.

PRIOR ART DOCUMENT

Patent Document

Patent Document 1: Japanese Laid-Open Patent Publication No. 2008-085288

SUMMARY

A modification method according to one embodiment of the present disclosure includes: generating plasma by a microwave in an interior of a processing container in which a stage on which a substrate is placed is provided; and periodically applying a DC voltage to the stage in the interior of the processing container in which the plasma is generated by the generating the plasma, and irradiating the substrate with electrons in the plasma.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 14B is a diagram for explaining results of the experiment.

DETAILED DESCRIPTION

Hereinafter, embodiments of a modification method and a modification device disclosed in the present disclosure will be described in detail with reference to the drawings. The disclosed modification method and modification device are not limited to the present embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the related art, annealing and electron beam irradiation have been known as techniques for modifying a film formed on a substrate. However, since the modification by the annealing or electron beam irradiation has a wide range of action and high energy, it may damage a lower film, which makes it difficult to act on only an upper film. Therefore, a technique is needed to selectively modify the upper film while suppressing the damage to the lower film.

Embodiments

Figure 1:
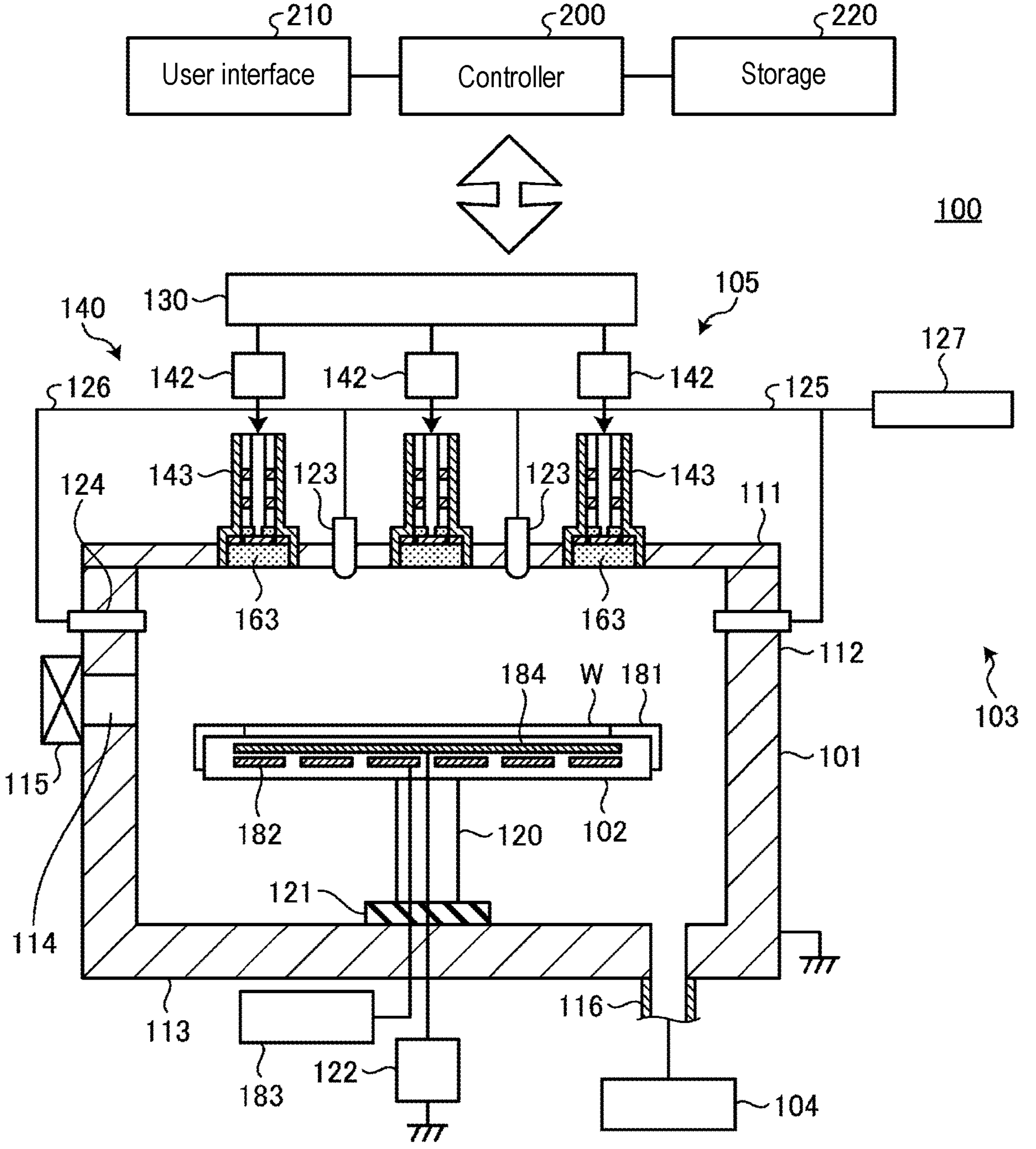
FIG. 1 is a schematic cross-sectional view showing an example of a plasma processing apparatus according to an embodiment.

An embodiment will be described. In the embodiment, a case in which a modification process including the modification method disclosed herein is performed by a plasma processing apparatus which generates plasma by microwaves will be described. FIG. 1 is a schematic cross-sectional view showing an example of a plasma processing apparatus 100 according to an embodiment. The plasma processing apparatus 100 shown in FIG. 1 includes a processing container 101, a stage 102, a gas supply mechanism 103, an exhaust device 104, a microwave introduction device 105, and a controller 200. In this embodiment, the plasma processing apparatus 100 corresponds to a modification apparatus of the present disclosure.

The processing container 101 accommodates a substrate W such as a semiconductor wafer. A film to be modified is formed on a surface of the substrate W. The processing container 101 includes the stage 102 provided therein. The substrate W is placed on the stage 102. The gas supply mechanism 103 supplies a gas into the processing container 101. The exhaust device 104 exhausts an interior of the processing container 101. The microwave introduction device 105 generates a microwave for generating plasma inside the processing container 101 and introduces the microwave into the processing container 101. The controller 200 controls an operation of each part of the plasma processing apparatus 100.

The processing container 101 is formed of a metal material such as aluminum and an alloy thereof and has a substantially cylindrical shape. The processing container 101 includes a plate-shaped ceiling wall portion 111, a bottom wall 113 and a sidewall 112 connecting them. An inner wall of the processing container 101 is coated with yttria ($Y_2O_3$) or the like to provide a protective film. The microwave introduction device 105 is provided above the processing container 101 and introduces an electromagnetic wave (microwave) into the processing container 101 to generate plasma. The microwave introduction device 105 will be described in detail later.

The ceiling wall portion 111 includes a plurality of openings into which a microwave radiation mechanism 143 and a gas introduction nozzle 123, which will be described later, of the microwave introduction device 105 are fitted. The sidewall 112 includes a loading/unloading port 114 for loading/unloading the substrate W between the processing container 101 and a transfer chamber (not shown) adjacent to the processing container 101. In addition, a gas introduction nozzle 124 is provided on the sidewall 112 at a position above the stage 102. The loading/unloading port 114 is opened/closed by a gate valve 115.

An opening is provided in the bottom wall 113, and the exhaust device 104 is provided in an exhaust pipe 116 connected to the opening. The exhaust device 104 includes a vacuum pump and a pressure control valve. The interior of the processing container 101 is exhausted via the exhaust pipe 116 by the vacuum pump of the exhaust device 104. An internal pressure of the processing container 101 is controlled by the pressure control valve of the exhaust device 104.

The stage 102 is formed in a disc shape. The stage 102 is formed of a dielectric material. For example, the stage 102 is made of aluminum whose surface is anodized, or a ceramic material such as aluminum nitride (AlN). The substrate W is placed on an upper surface of the stage 102. The stage 102 is supported by a cylindrical support member 120 and base member 121 which are made of ceramics such as AlN and extend upward from the center of the bottom of the processing container 101. A guide ring 181 for guiding the substrate W is provided on an outer edge of the stage 102. Further, lifting pins (not shown) for lowering/raising the substrate W are provided inside the stage 102 to move upward and downward with respect to the upper surface of the stage 102.

Further, a resistance heater 182 is embedded in the stage 102. The heater 182 heats the substrate W placed on the stage 102 by being supplied with power from a heater power supply 183. Further, a thermocouple (not shown) is embedded in the stage 102. A heating temperature of the substrate W may be controlled based on a signal from the thermocouple. Further, an electrode 184 having a size similar to that of the substrate W is buried above the heater 182 in the stage 102. A DC power supply 122 is electrically connected to the electrode 184. The DC power supply 122 periodically applies a DC voltage to the electrode 184 in the stage 102. For example, the DC power supply 122 is configured to include a DC power supply and a pulse unit. The DC power supply 122 periodically applies a pulsed DC voltage to the electrode 184 by turning on/off the DC voltage supplied by the DC power supply using the pulse unit.

The gas supply mechanism 103 supplies various types of gases into the processing container 101. The gas supply mechanism 103 includes gas introduction nozzles 123 and 124, gas supply pipes 125 and 126, and a gas supplier 127. The gas introduction nozzle 123 is fitted into the opening formed in the ceiling wall portion 111 of the processing container 101. The gas introduction nozzle 124 is fitted into the opening formed in the sidewall 112 of the processing container 101. The gas supplier 127 is connected to each gas introduction nozzle 123 via the gas supply pipe 125. The gas supplier 127 is also connected to each gas introduction nozzle 124 via the gas supply pipe 126. The gas supplier 127 includes sources of various types of gases. The gas supplier 127 is also provided with an opening/closing valve for starting and stopping the supply of various types of gases, and a flow rate adjuster for adjusting a flow rate of a gas. For example, when performing the modification process, the gas supplier 127 supplies a processing gas used for modification. Examples of the processing gas may include Ar (argon), Ne (neon), $N_2$ (nitrogen), and the like. As the processing gas, a noble gas other than Ar and Ne may be used. The noble gas and $N_2$ may be used in any combination, and a gas ratio thereof is not particularly limited. The processing gas may also include $H_2$ and $NH_3$. In this case, it is preferable that the processing gas includes 90% or more of the noble gas and the $N_2$ gas, and 10% or less of $H_2$ and $NH_3$.

The microwave introduction device 105 is provided above the processing container 101. The microwave introduction device 105 introduces the electromagnetic wave (microwave) into the processing container 101 to generate plasma.

The microwave introduction device 105 includes a microwave outputter 130 and an antenna unit 140. The microwave outputter 130 generates the microwave and distributes the microwave to multiple paths for output. The antenna unit 140 introduces the microwave output from the microwave outputter 130 into the processing container 101.

The microwave outputter 130 includes a microwave power supply, a microwave oscillator, an amplifier, and a distributor. The microwave oscillator is a solid state and oscillates (for example, PLL-oscillates) the microwave at, for example, 860 MHz. A frequency of the microwave is not limited to 860 MHz and may be in a range of 700 MHz to 10 GHz, such as 2.45 GHz, 8.35 GHz, 5.8 GHz, and 1.98 GHz. The amplifier amplifies the microwave oscillated by the microwave oscillator. The distributor distributes the microwave amplified by the amplifier to multiple paths. The distributor distributes the microwave while matching impedances between input and output sides.

The antenna unit 140 includes a plurality of antenna modules. Three antenna modules of the antenna unit 140 are shown in FIG. 1. Each antenna module includes an amplifier 142 and a microwave radiation mechanism 143. The microwave outputter 130 generates the microwave, and distributes the microwave to output the same to each antenna module. The amplifier 142 of the antenna module mainly amplifies the distributed microwave and outputs the same to the microwave radiation mechanism 143. The microwave radiation mechanism 143 is provided on the ceiling wall portion 111. The microwave radiation mechanism 143 radiates the microwave output from the amplifier 142 into the processing container 101.

The amplifier 142 includes a phase shifter, a variable gain amplifier, a main amplifier, and an isolator. The phase shifter changes a phase of the microwave. The variable gain amplifier adjusts a power level of the microwave input to the main amplifier. The main amplifier is configured as a solid-state amplifier. The isolator separates a reflected microwave which is reflected by an antenna part of the microwave radiation mechanism 143 (to be described later) and heads toward the main amplifier.

As shown in FIG. 1, a plurality of microwave radiation mechanisms 143 are provided on the ceiling wall portion 111. Each microwave radiation mechanism 143 includes a cylindrical outer conductor, and an inner conductor arranged coaxially with the outer conductor inside the outer conductor. Further, the microwave radiation mechanism 143 includes a coaxial tube having a microwave transmission line between the outer conductor and the inner conductor, and an antenna part which radiates the microwave into the processing container 101. A microwave transmission plate 163, which is fitted into the ceiling wall portion 111, is provided on a lower surface side of the antenna part. A lower surface of the microwave transmission plate 163 is exposed to an internal space of the processing container 101. The microwave that have transmitted through the microwave transmission plate 163 generate plasma in the internal space of the processing container 101.

Figure 2:
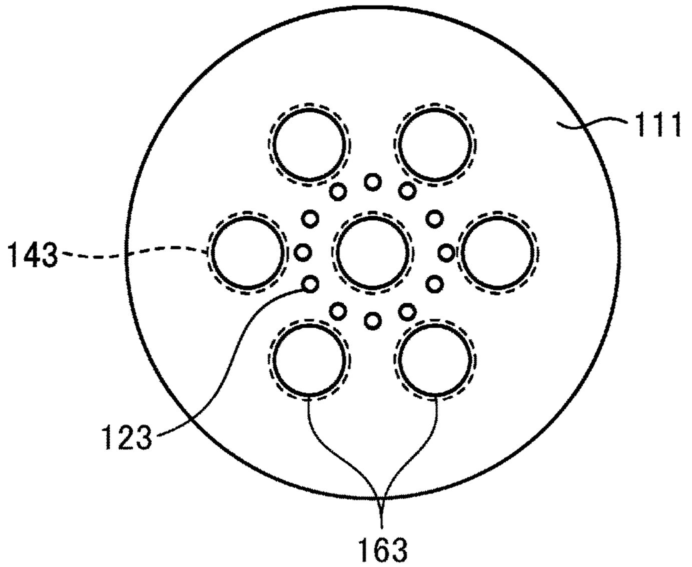
FIG. 2 is a view showing an example of an arrangement of antenna modules in a ceiling wall portion according to an embodiment.

FIG. 2 is a view showing an example of an arrangement of antenna modules in the ceiling wall portion 111 according to an embodiment. As shown in FIG. 2, seven microwave radiation mechanisms 143 of the antenna modules are provided in the ceiling wall portion 111. Six of the microwave radiation mechanisms 143 are arranged at vertices of a regular hexagon, and a remaining one is arranged at the center of the regular hexagon. In addition, microwave transmission plates 163 are arranged on the ceiling wall portion 111 in correspondence with the seven microwave radiation mechanisms 143. These seven microwave transmission plates 163 are arranged so that adjacent microwave transmission plates 163 are arranged at equal intervals. In addition, a plurality of gas introduction nozzles 123 of the gas supply mechanism 103 are arranged so as to surround the periphery of the central microwave transmission plate. The number of antenna modules provided on the ceiling wall portion 111 is not limited to seven.

The antenna unit 140 according to the embodiment is capable of adjusting the power of the microwave radiated from the microwave radiation mechanism 143 of each antenna module by controlling the amplifier 142 of each antenna module.

In a case in which a power density of the microwave may be appropriately controlled, a microwave plasma source equipped with a single microwave introducer having a size corresponding to the substrate W may be used.

The operation of the plasma processing apparatus 100 configured as described above is controlled by the controller 200. A user interface 210 and a storage 220 are connected to the controller 200.

The user interface 210 includes an operation part such as a keyboard through which a process manager inputs commands to manage the plasma processing apparatus 100, and a display which visually displays an operating status of the plasma processing apparatus 100. The user interface 210 receives various operations. For example, the user interface 210 receives a predetermined operation to instruct the start of plasma processing.

The storage 220 is a storage device configured to store various types of data. For example, the storage 220 is a storage device such as a hard disk, a solid state drive (SSD), or an optical disc. The storage 220 may be a semiconductor memory that allows data to be rewritten, such as a random access memory (RAM), a flash memory, or a non-volatile static random access memory (NVSRAM).

The storage 220 stores an operating system (OS) and various recipes executed by the controller 200. For example, the storage 220 stores various recipes including a recipe for executing the modification process which will be described later. Further, the storage 220 stores various data used in the recipes. The programs and data may be used in a state of being stored in a non-transitory computer-readable computer recording medium (e.g., a hard disk, a CD, a flexible disk, a semiconductor memory, and the like.). Alternatively, the programs and data may also be used online by transmitting them from other devices at any time via, for example, a dedicated line.

The controller 200 is a device which controls the plasma processing apparatus 100. The controller 200 may be an electronic circuit such as a CPU (Central Processing Unit) or an MPU (Micro Processing Unit), or an integrated circuit such as an ASIC (Application Specific Integrated Circuit) or an FPGA (Field Programmable Gate Array). The controller 200 includes an internal memory for storing programs and control data that define various processing procedures, and executes various processes using these.

The controller 200 controls each part of the plasma processing apparatus 100. For example, the controller 200 controls each part of the plasma processing apparatus 100 to perform the modification process according to the recipe of the recipe data stored in the storage 220.

In the plasma processing apparatus 100, the substrate W on which a film is formed is placed on the stage 102. The film is, for example, a protective film or insulating film such as a spin-coated silicon nitride film (SiNx film). The film is formed on the substrate W by, for example, spin coating.

The plasma processing apparatus 100 performs the modification process on the substrate W placed on the stage 102. The plasma processing apparatus 100 generates plasma by a microwave inside the processing container 101. For example, the controller 200 controls the gas supplier 127 and the microwave introduction device 105 to supply a processing gas used for modification from the gas supplier 127 into the processing container 101 while introducing the microwave from the microwave introduction device 105 into the processing container 101 to generate plasma.

The plasma processing apparatus 100 periodically applies the DC voltage to the stage 102 inside the processing container 101 in which the plasma is generated, and irradiates the substrate W with electrons in the plasma. For example, the controller 200 controls the DC power supply 122 to periodically apply the DC voltage from the DC power supply 122 to the stage 102, and irradiates the substrate W with electrons in the plasma.

Figure 3:
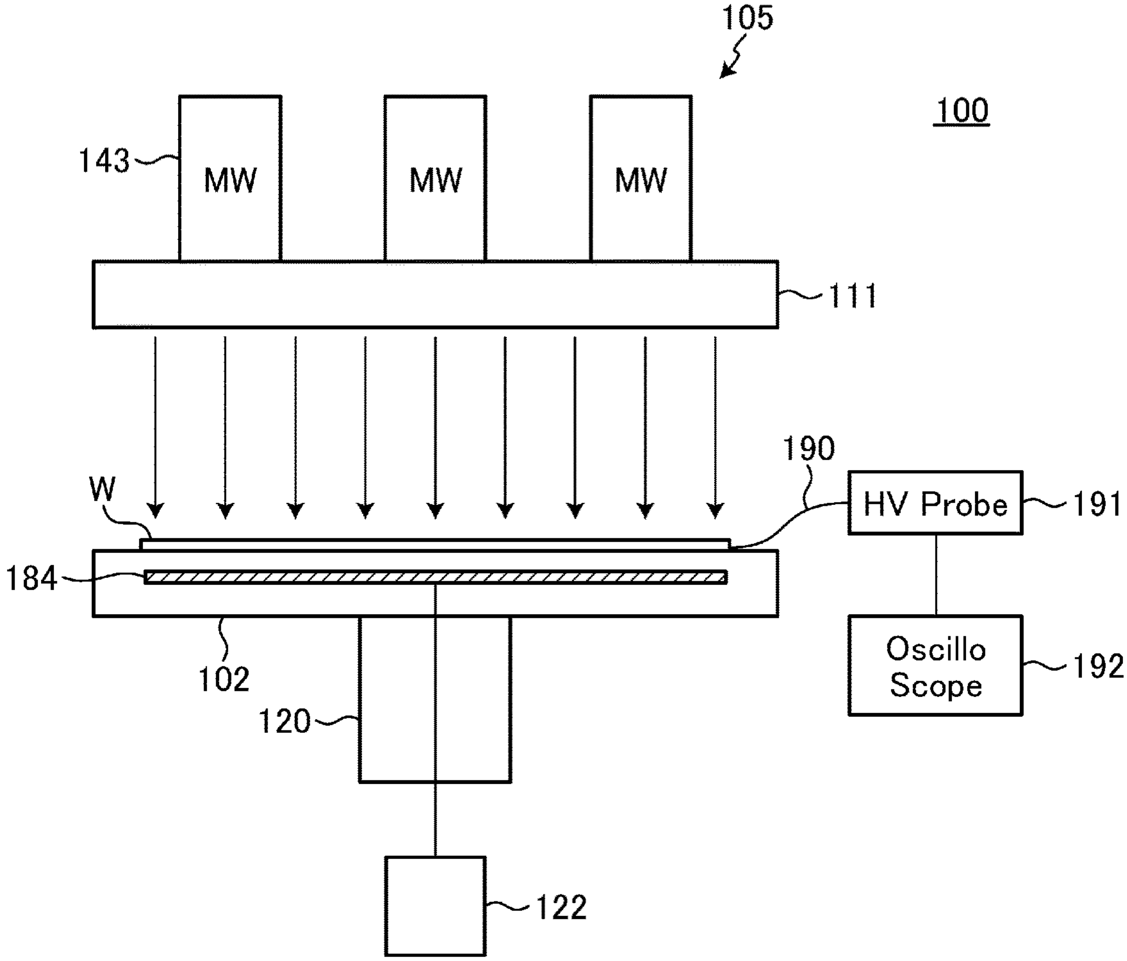
FIG. 3 is a schematic view showing an example of a configuration for measuring a voltage of a substrate.

Here, a change in voltage of the substrate W caused by periodically applying the DC voltage to the stage 102 in the modification process will be described. A voltage of the substrate W is measured by the following configuration. FIG. 3 is a view showing an example of a configuration for measuring the voltage of the substrate W. FIG. 3 schematically shows an example of the plasma processing apparatus 100. For example, nickel foil to which one end of a wiring 190 is connected is placed under the substrate W, and a voltage of a high voltage (HV) probe 191 to which the other end of the wiring 190 is connected is measured by an oscilloscope 192, thereby measuring the voltage of the substrate W.

Figure 4:
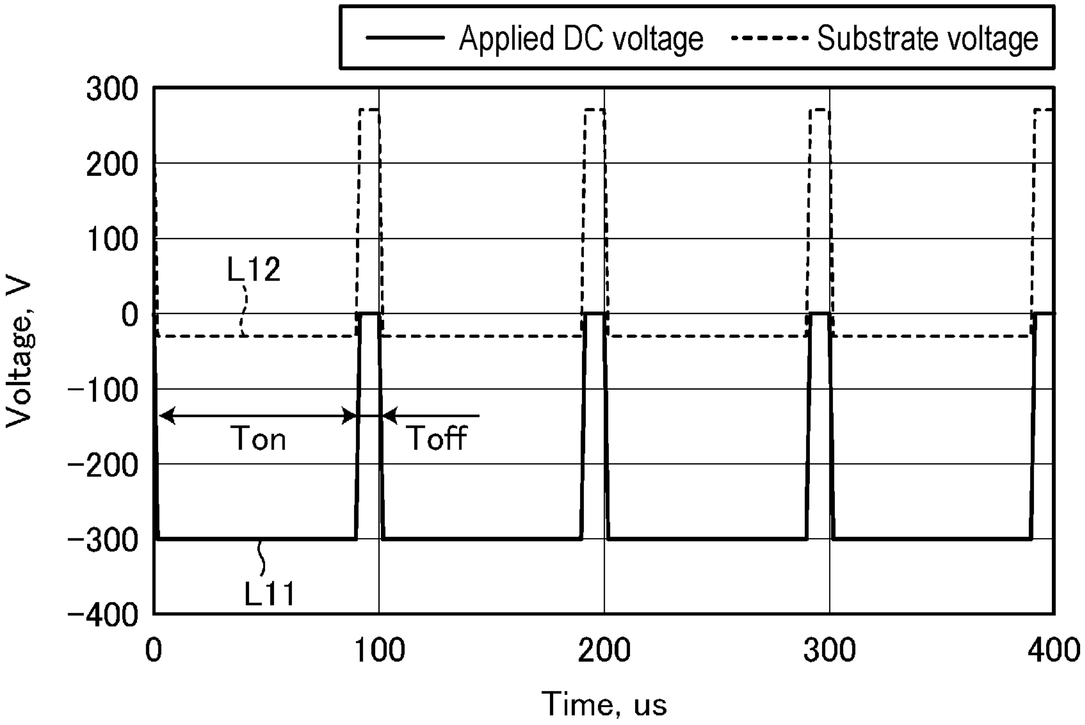
FIG. 4 is a diagram showing an example of an ideal change in voltage of the substrate.

FIG. 4 is a diagram showing an example of an ideal change in voltage of the substrate W. In FIG. 4, the horizontal axis represents elapsed time and the vertical axis represents a voltage. FIG. 4 shows a waveform L11 of the DC voltage periodically applied to the stage 102. FIG. 4 also shows a waveform L12 of an ideal change in voltage of the substrate W when the DC voltage is periodically applied to the stage 102. FIG. 4 shows a case in which the DC voltage of −300V is periodically applied to the stage 102. The stage 102 is formed of a dielectric material, and the electrode 184 in the stage 102 to which the DC voltage is applied and the substrate W function as electrodes of a capacitor. The voltage of the substrate W changes in a rectangular shape according to the DC voltage applied in a rectangular shape to the electrode 184. Ideally, as shown in the waveform L12, the substrate W has a negative voltage during an On-period Ton when the DC voltage of −300V is applied, and a positive voltage during an Off-period Toff when the DC voltage is in OFF state.

Figure 5A:
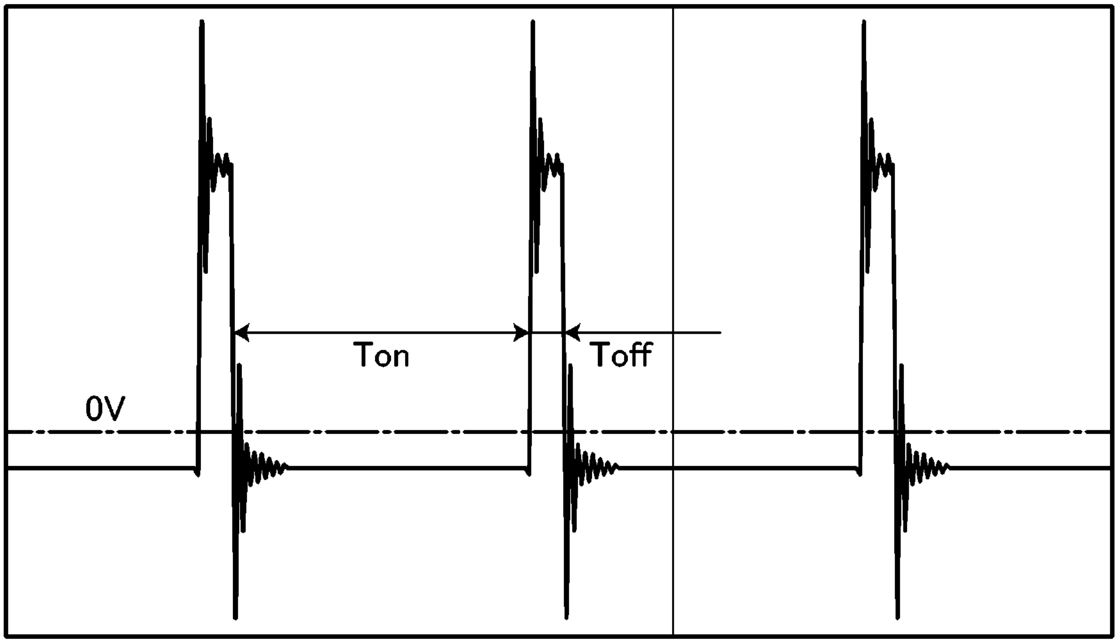
FIG. 5A is a diagram showing an example of a change in voltage of a substrate in the plasma processing apparatus according to the embodiment.
Figure 5B:
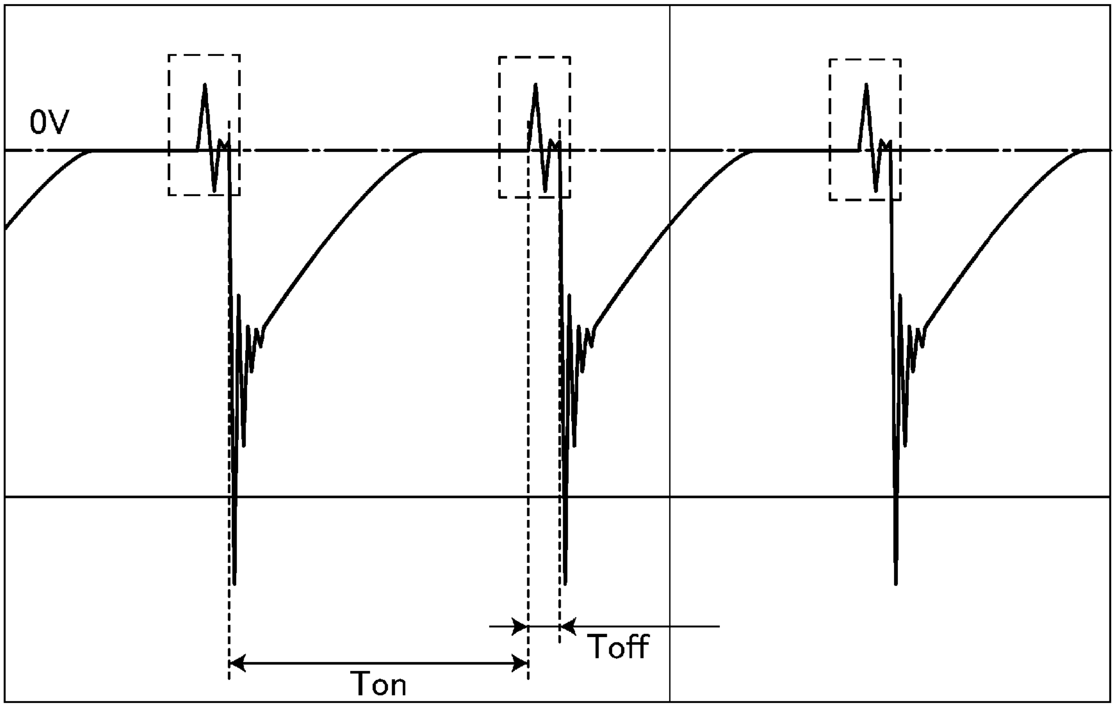
FIG. 5B is a diagram showing an example of a change in voltage of a substrate in the plasma processing apparatus according to the embodiment.

FIGS. 5A and 5B are diagrams showing an example of a change in voltage of the substrate W in the plasma processing apparatus 100 according to the embodiment. In FIGS. 5A and 5B, the horizontal axis represents the elapsed time and the vertical axis represents a voltage. FIGS. 5A and 5B show waveforms of an actual change in voltage of the substrate W when the DC voltage is periodically applied to the stage 102. FIG. 5A shows a change in voltage of the substrate W when there is no plasma in the processing container 101. FIG. 5B shows a change in voltage of the substrate W when plasma is generated in the processing container 101.

When there is no plasma in the processing container 101, the voltage of the substrate W becomes a negative voltage during an On-period Ton and a positive voltage during an Off-period Toff, as shown in FIG. 5A. When there is no plasma in the processing container 101, the voltage of the substrate W changes in a rectangular shape which is close to the ideal waveform L12 shown in FIG. 4.

On the other hand, when plasma is generated in the processing container 101, the voltage of the substrate W becomes a negative voltage at the beginning of the On-period Ton, as shown in FIG. 5B. However, positive ions in the plasma are attracted to the substrate W by the negative voltage, and the negative voltage is gradually reduced. Then, when the Off-period Toff begins, the voltage of the substrate W swings to the positive side due to the influence of the positive charges of the attracted ions. Electrons in the plasma are attracted to the substrate W by this positive voltage, so that the film formed on the substrate W may be modified by the attracted electrons.

Figures 6A, 6B, 6C, 6D, 6E:
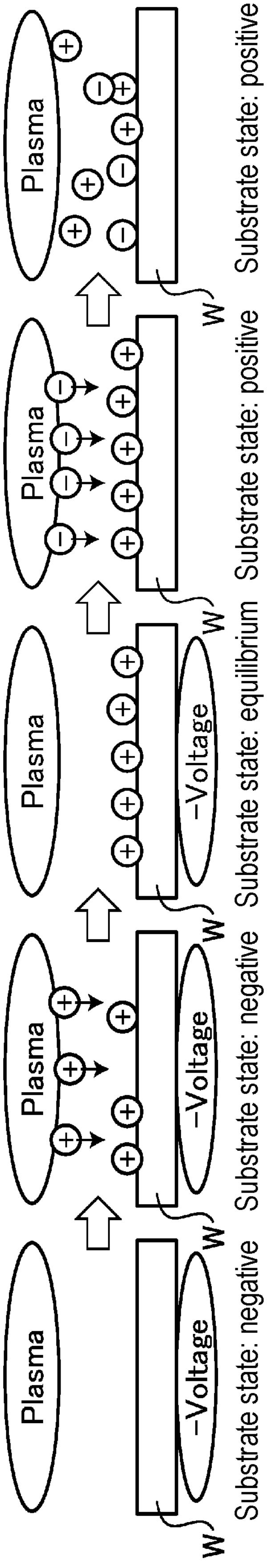
FIGS. 6A to 6E are schematic views showing an example of a change in electrical state of a substrate due to a modification process according to an embodiment.

FIGS. 6A to 6E are schematic views showing an example of a change in electrical state of the substrate W due to the modification process according to an embodiment. FIGS. 6A to 6E show a change in electrical state of the substrate W during one cycle when the DC voltage is periodically applied to the stage 102 while plasma is generated inside the processing container 101, as shown in FIG. 5B. When the On-period Ton begins and the negative DC voltage is applied to the stage 102, the substrate W has a negative voltage as shown in FIG. 6A. Positive ions in the plasma are attracted to the substrate W by this negative voltage, as shown in FIG. 6B. By attracting the positive ions, the negative voltage is gradually reduced. Then, the substrate W reaches an equilibrium state with zero voltage as shown in FIG. 6C. Then, when the Off-period Toff begins and the negative DC voltage is removed, the voltage of the substrate W swings to the positive side due to the influence of the positive charges of the attracted ions, as shown in FIG. 6D. Electrons in the plasma are attracted to the substrate W by this positive voltage. By attracting the electrons, the positive voltage of the substrate W is gradually reduced, as shown in FIG. 6E. In the modification process according to the embodiment, the negative DC voltage is periodically applied to the stage 102, and the substrate W is temporarily made to have a positive voltage during the Off-period Toff to attract electrons to the substrate W, thereby modifying the film formed on the substrate W. This makes it possible to selectively modify an upper film while suppressing damage to a lower film.

Next, results of searching for the process conditions under which the peak value of the positive voltage generated on the substrate W during the Off-period Toff is large in the modification process according to the embodiment will be described.

First, a case in which the period for applying the DC voltage is changed will be described. In the plasma processing apparatus 100 according to the embodiment, plasma is generated inside the processing container 101 under the following process conditions, and the peak value of a positive voltage generated on the substrate W is measured while changing the period of applying the DC voltage.

<Process Conditions>

Microwave power: 700 [W]

Internal pressure of processing container 101: 50 m[Torr] (6.6 [Pa])

Gas species and flow rate of processing gas: $Ar/N_2$:300/20 [sccm]

DC voltage: −300[V]

Proportion (duty ratio) of the period during which DC voltage is in ON state per cycle: 80%

Figure 7A:
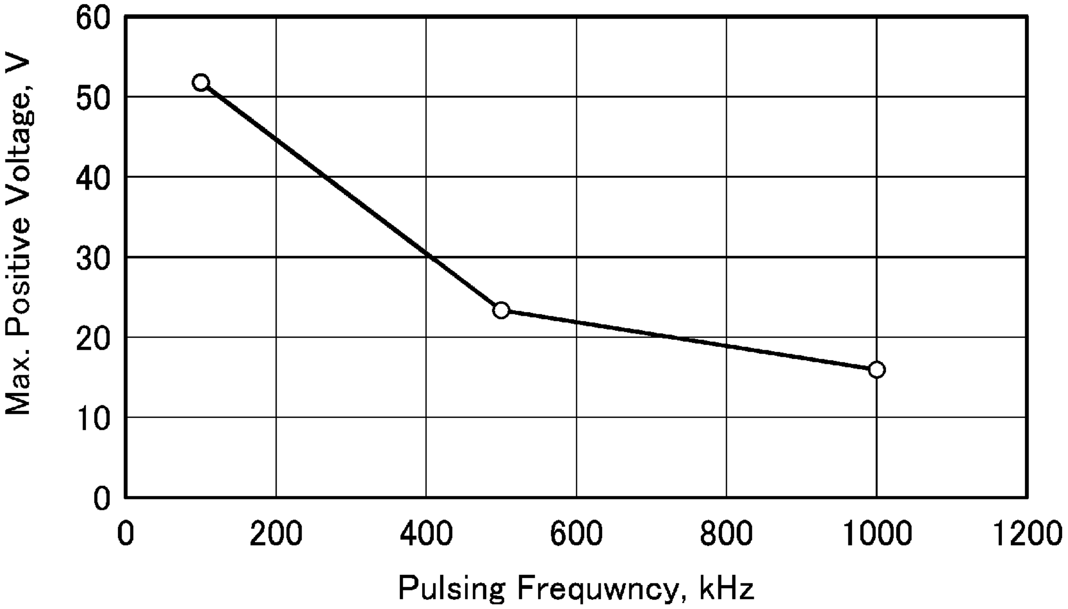
FIG. 7A is a diagram showing an example of a relationship between a frequency of a DC voltage and a peak value of a positive voltage generated on a substrate according to an embodiment.

FIG. 7A is a diagram showing an example of a relationship between a frequency of the DC voltage and the peak value of the positive voltage generated on the substrate W according to an embodiment. In FIG. 7A, the horizontal axis represents the frequency of the DC voltage and the vertical axis represents the peak value of the positive voltage generated on the substrate W during the Off-period Toff. FIG. 7A shows the peak value of the positive voltage generated on the substrate W when the frequency at which the DC voltage is applied is in a range of 100 k to 1,000 [Hz]. As shown in FIG. 7A, the lower the frequency of the DC voltage, the higher the peak value of the positive voltage generated on the substrate W, so that a high voltage may be applied to the substrate W. To increase the peak value, it is preferable that the frequency of the DC voltage is low. Therefore, it is preferable that the period during which the DC voltage is applied is long.

Next, a case in which the proportion (duty ratio) of the period during which the DC voltage is in ON state per cycle is changed will be described. In the plasma processing apparatus 100 according to the embodiment, plasma is generated inside the processing container 101 under the following process conditions, and the peak value of the positive voltage generated on the substrate W is measured while changing the duty ratio.

<Process Conditions>

Microwave power: 700 [W]

Internal pressure of processing container 101: 50 m[Torr] (6.6 [Pa])

Gas species and flow rate of processing gas: $Ar/N_2$:300/20 [sccm]

DC voltage: −300[V]

Frequency at which DC voltage is applied: 100 k[Hz]

Figure 7B:
FIG. 7B is a diagram showing an example of a relationship between a duty ratio per cycle and the peak value of the positive voltage generated on the substrate according to an embodiment.

FIG. 7B is a diagram showing an example of a relationship between a duty ratio per cycle and the peak value of the positive voltage generated on the substrate W according to an embodiment. In FIG. 7B, the horizontal axis represents the duty ratio and the vertical axis represents the peak value of the positive voltage generated on the substrate W during the Off-period Toff. FIG. 7B shows the peak value of the positive voltage for a duty ratio range of 20 to 80[%]. As shown in FIG. 7B, the higher the duty ratio, the higher the peak value of the positive voltage generated on the substrate W, so that a high voltage may be applied to the substrate W. To increase the peak value, it is preferable that the duty ratio is high.

Figures 7C, 8A:
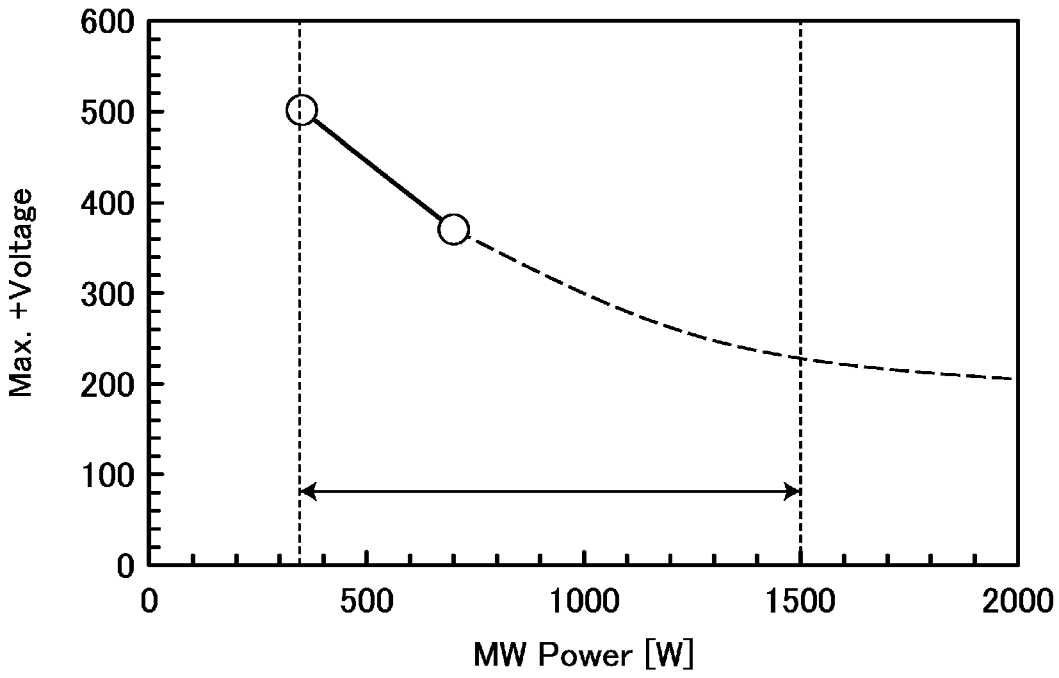
FIG. 7C is a diagram showing an On-period according to a frequency and a duty ratio according to an embodiment.
FIG. 8A is a diagram showing an example of a relationship between microwave power and the peak value of the positive voltage generated on the substrate according to an embodiment.

FIG. 7C is a diagram showing the On-period Ton according to the frequency and duty ratio in the embodiment. FIG. 7C shows the time (μ[sec]) of the On-period Ton per cycle when the frequency at which the DC voltage is applied is 50, 100, 200, 500, and 1,000 k[Hz] and the duty ratio is 20, 50, 80, and 90%.

Here, as described with reference to FIGS. 5B and 6, in the modification process according to the embodiment, the positive ions are attracted to the substrate W during the On-period Ton, so that the substrate W has the positive voltage during the Off-period Toff. In the modification process according to the embodiment, when the On-period Ton is short and the positive ions may not be sufficiently attracted to the substrate W, the peak value of the positive voltage during the Off-period Toff becomes low. In order to attract enough positive ions to reach an equilibrium state where the voltage is zero, the On-period Ton needs to be 4μ[sec] or more. On the other hand, when the On-period Ton is long, the period of one cycle becomes long. In the modification process according to the embodiment, when the period of one cycle becomes long, the time required for processing becomes long and productivity decreases. Therefore, it is preferable that the On-period Ton is 4μ to 10μ[sec]. In FIG. 7C, a pattern is applied to a portion where the On-period Ton is 4μ to 10μ[sec]. In the modification process according to the embodiment, when the frequency at which the DC voltage is applied is 50 k[Hz], it is preferable that the duty ratio is 20 to 50%. In addition, when the frequency at which the DC voltage is applied is 100 k[Hz], it is preferable that the duty ratio is 50 to 90%. Further, when the frequency at which the DC voltage is applied is 200 k[Hz], it is preferable that the duty ratio is 80 to 90%.

Next, a case in which the microwave power is changed will be described. In the plasma processing apparatus 100 according to the embodiment, under the following process conditions, plasma is generated inside the processing container 101 while changing the microwave power, and the peak value of the positive voltage generated on the substrate W is measured while applying the DC voltage periodically.

<Process Conditions>

Internal pressure of processing container 101: 50 m[Torr] (6.6 [Pa])

Gas species and flow rate of processing gas: $Ar/N_2$:300/20 [sccm]

DC voltage: −800[V]

Frequency at which DC voltage is applied: 100 k[Hz]

Proportion (duty ratio) of the period during which the DC voltage is in ON state on per cycle: 90%

FIG. 8A is a diagram showing an example of a relationship between the microwave power and the peak value of the positive voltage generated on the substrate W according to an embodiment. In FIG. 8A, the horizontal axis represents the microwave power and the vertical axis represents the peak value of the positive voltage generated on the substrate W during the Off-period Toff. FIG. 8A shows the peak value of the positive voltage for the microwave power in a range of 350 to 2,000 [W]. As shown in FIG. 8A, the lower the microwave power, the higher the peak value of the positive voltage generated on the substrate W. However, when the microwave power is too low, plasma may not be generated in the processing container 101. Therefore, microwave power of 175 W or more is required to stably generate plasma. In addition, when the peak value of the positive voltage effective for the modification process is, for example, 250[V] or more, in the modification process according to the embodiment, in order to obtain the peak value of the positive voltage of 250[V] or more, it is preferable that the microwave power is 175 to 1,500 [W].

Next, a case in which the internal pressure of the processing container 101 is changed will be described. In the plasma processing apparatus 100 according to the embodiment, under the following process conditions, plasma is generated inside the processing container 101 while changing the internal pressure of the processing container 101, and the peak value of a positive voltage generated on the substrate W is measured while applying the DC voltage periodically.

<Process Conditions>

Microwave power: 700 [W]

Gas species and flow rate of processing gas: $Ar/N_2$:300/20 [sccm]

DC voltage: −800[V]

Frequency at which DC voltage is applied: 100 k[Hz]

Proportion (duty ratio) of the period during which the DC voltage is in ON state per cycle: 90%

Figure 8B:
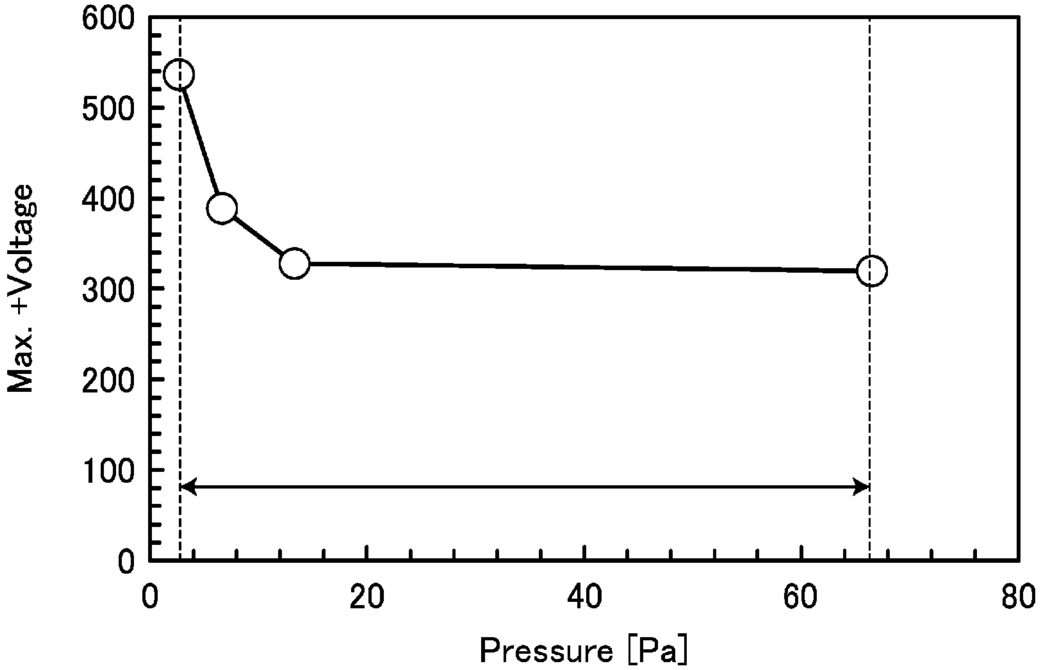
FIG. 8B is a diagram showing an example of a relationship between an internal pressure of a processing container and the peak value of the positive voltage generated on the substrate according to an embodiment.

FIG. 8B is a diagram showing an example of a relationship between the internal pressure of the processing container 101 and the peak value of the positive voltage generated on the substrate W according to an embodiment. In FIG. 8B, the horizontal axis represents the internal pressure of the processing container 101 and the vertical axis represents the peak value of the positive voltage generated on the substrate W during the Off-period Toff. FIG. 8B shows the peak value of the positive voltage for the internal pressure of the processing container 101 in a range of about 2 to 75 [Pa]. As shown in FIG. 8B, the lower the internal pressure of the processing container 101, the higher the peak value of the positive voltage generated on the substrate W. However, when the internal pressure of the processing container 101 is too low, plasma may not be generated in the processing container 101. The peak value of the positive voltage effective for the modification process is, for example, 250[V] or more. Although not shown in FIG. 8B, even when the internal pressure of the processing container 101 is about 100 [Pa], the peak value of the positive voltage is 250[V] or more. In the modification process according to the embodiment, in order to obtain the peak value of the positive voltage of 250[V] or more, it is preferable that the internal pressure of the processing container 101 is 2 to 100 [Pa].

Next, a case in which the periodically-applied DC voltage is changed will be described. In the plasma processing apparatus 100 according to the embodiment, plasma is generated inside the processing container 101 under the following process conditions, and the peak value of the positive voltage generated on the substrate W is measured while changing a voltage to apply the DC voltage periodically.

<Process Conditions>

Microwave power: 700 [W]

Internal pressure of processing container 101: 50 m[Torr] (6.6 [Pa])

Gas species and flow rate of processing gas: $Ar/N_2$:300/20 [sccm]

Frequency at which DC voltage is applied: 100 k[Hz]

Proportion (duty ratio) of the period during which the DC voltage is in ON state per cycle: 90%

Figure 8C:
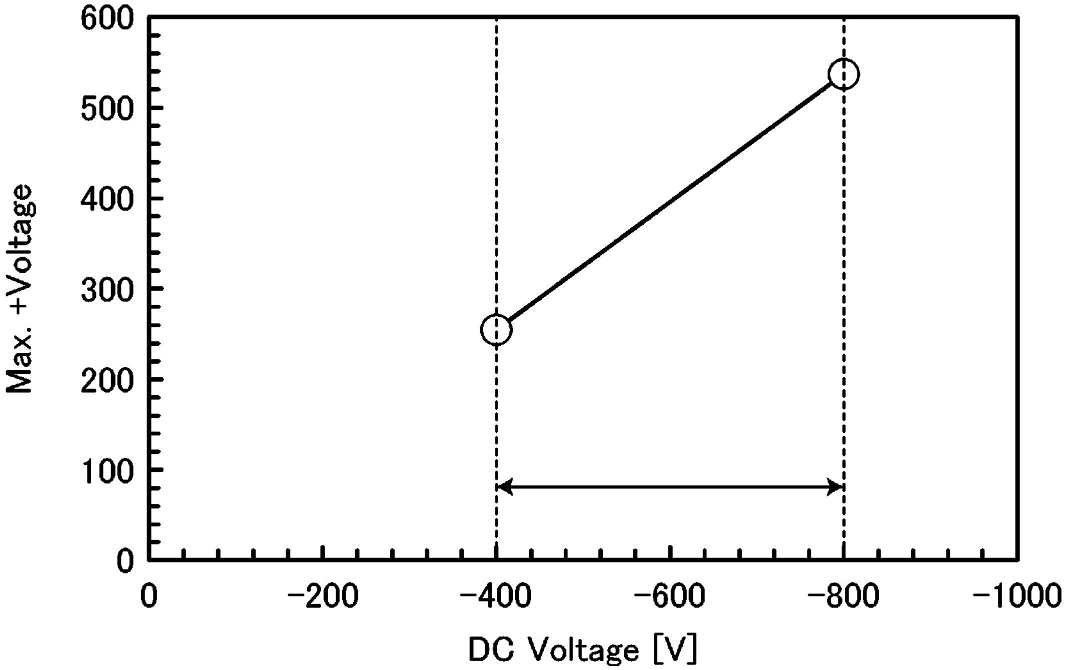
FIG. 8C is a diagram showing an example of a relationship between a periodically-applied DC voltage and the peak value of the positive voltage generated on the substrate according to an embodiment.

FIG. 8C is a diagram showing an example of a relationship between the periodically-applied DC voltage and the peak value of the positive voltage generated on the substrate W according to an embodiment. In FIG. 8C, the horizontal axis represents the periodically-applied DC voltage and the vertical axis represents the peak value of the positive voltage generated on the substrate W during the Off-period Toff. FIG. 8C shows the peak value of the positive voltage for the periodically-applied DC voltage in a range of about −400 to −800[V]. In an experiment, the DC voltage is set to −800[V] on account of a withstand voltage of a feed-through. It is considered that when the withstand voltage of the feed-through is high, a larger negative voltage may be applied. As shown in FIG. 8C, the greater the negative value of the periodically-applied DC voltage, the higher the peak value of the positive voltage generated in the substrate W. In order to increase the peak value, it is preferable that the negative value of the periodically-applied DC voltage is large. The peak value of the positive voltage effective for the modification process is set to, for example, 250[V] or more. In the modification process according to the embodiment, in order to obtain the peak value of the positive voltage of 250[V] or more, it is preferable that the periodically-applied DC voltage is −400[V] or less.

Next, a case in which a gas species of processing gas used in the modification process is changed will be described. In the plasma processing apparatus 100 according to the embodiment, under the following process conditions, plasma is generated inside the processing container 101 with the gas species of the processing gas as $Ar/N_2$ and $He/N_2$, and the peak value of the positive voltage generated on the substrate W is measured while applying a DC voltage periodically.

<Process Conditions>

Microwave power: 350 [W]

Internal pressure of processing container 101: 25 m[Torr]

DC voltage: −800[V]

Frequency at which DC voltage is applied: 100 k[Hz]

Proportion (duty ratio) of the period during which DC voltage is in ON state per cycle: 90%

The flow rate of the processing gas is set to $Ar/N_2$: 300/20 [sccm] for Ar and $N_2$ and $He/N_2$: 75/10 [sccm] for He and $N_2$.

Figure 8D:
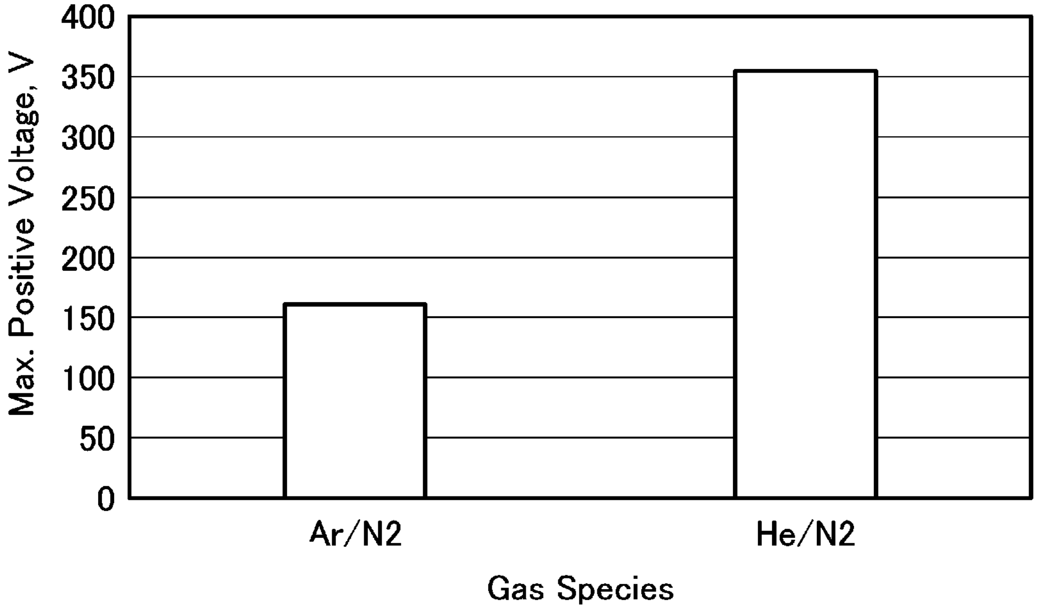
FIG. 8D is a diagram showing an example of a relationship between a gas species of a processing gas and the peak value of the positive voltage generated on the substrate according to an embodiment.

FIG. 8D is a diagram showing an example of a relationship between the gas species of the processing gas and the peak value of the positive voltage generated on the substrate W according to an embodiment. In FIG. 8D, the horizontal axis represents a case in which the gas species of the processing gas is Ar and $N_2$ ($Ar/N_2$) and a case in which the gas species of the processing gas is He and $N_2$ ($He/N_2$) and the vertical axis represents the peak value of the positive voltage generated on the substrate W during the Off-period Toff. FIG. 8D shows the peak value of the positive voltage when the gas species of processing gas is Ar and $N_2$ and when the gas species of processing gas is He and $N_2$. As shown in FIG. 8D, the peak value of the positive voltage generated on the substrate W is higher when the gas species of processing gas is He and $N_2$ than when the gas species of the processing gas is Ar and $N_2$. This is thought to be because the plasma density is reduced due to the high ionization voltage of He. In the modification process according to the embodiment, in order to obtain a higher peak value of the positive voltage, it is preferable to use He and $N_2$ as the gas species of the processing gas.

Next, a case in which the flow rate ratio of the processing gas used in the modification process is changed will be described. In the plasma processing apparatus 100 according to the embodiment, under the following process conditions, plasma is generated inside the processing container 101 while changing the flow rate ratio of He and $N_2$ as the processing gas, and the peak value of the positive voltage generated on the substrate W is measured while applying the DC voltage periodically.

<Process Conditions>

Microwave power: 350 [W]

Internal pressure of processing container 101: 20 m[Torr]

Gas species of processing gas: He/$N_2$

DC voltage: −800[V]

Frequency at which DC voltage is applied: 100 k[Hz]

Proportion (duty ratio) of the period during which DC voltage is in ON state per cycle: 90%

The flow rate ratio of He and $N_2$, which are the processing gases, is set such that the flow rate of He is 150 [sccm] and the ratio of $N_2$ to He is determined by changing the flow rate of $N_2$.

Figure 8E:
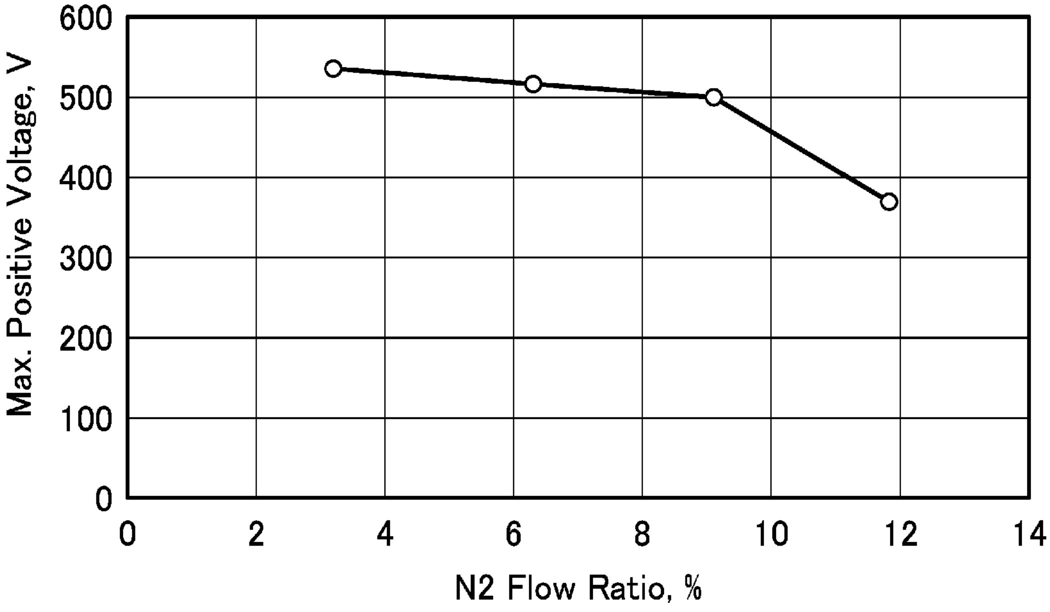
FIG. 8E is a diagram showing an example of a relationship between a flow rate ratio of the processing gas and the peak value of the positive voltage generated on the substrate according to an embodiment.

FIG. 8E is a diagram showing an example of a relationship between the flow rate ratio of the processing gas and the peak value of the positive voltage generated on the substrate W according to an embodiment. In FIG. 8E, the horizontal axis represents the flow rate ratio of $N_2$ to He and the vertical axis represents the peak value of the positive voltage generated on the substrate W during the Off-period Toff. FIG. 8E shows the peak value of the positive voltage when the flow rate ratio of $N_2$ to He is 3 to 12%. As shown in FIG. 8E, the lower the flow rate ratio of $N_2$ to He, the higher the peak value of the positive voltage generated on the substrate W. Since He is hard to be ionized, $N_2$ becomes the main raw material of plasma. It is considered that the positive voltage increases because the amount of $N_2$, which is the raw material of plasma, decreases when the flow rate ratio is low, and the electron density decreases. In the modification process according to the embodiment, in order to obtain a higher peak value of the positive voltage, it is preferable that the flow rate ratio of $N_2$ to He is low. Further, plasma is not ignited when the flow rate of $N_2$ is 0 [sccm].

From the above results, the following maximum conditions are obtained as the process conditions which maximize the peak value of the positive voltage generated on the substrate W.

<Maximum Conditions>

Microwave power: 350 [W]

Internal pressure of processing container 101: 20 m[Torr]

Gas species and flow rate of processing gas: He/$N_2$: 150/5 [sccm]

DC voltage: −800[V]

Frequency at which DC voltage is applied: 100 k[Hz]

Proportion (duty ratio) of the period during which DC voltage is in ON state per cycle: 90%

Figure 9A:
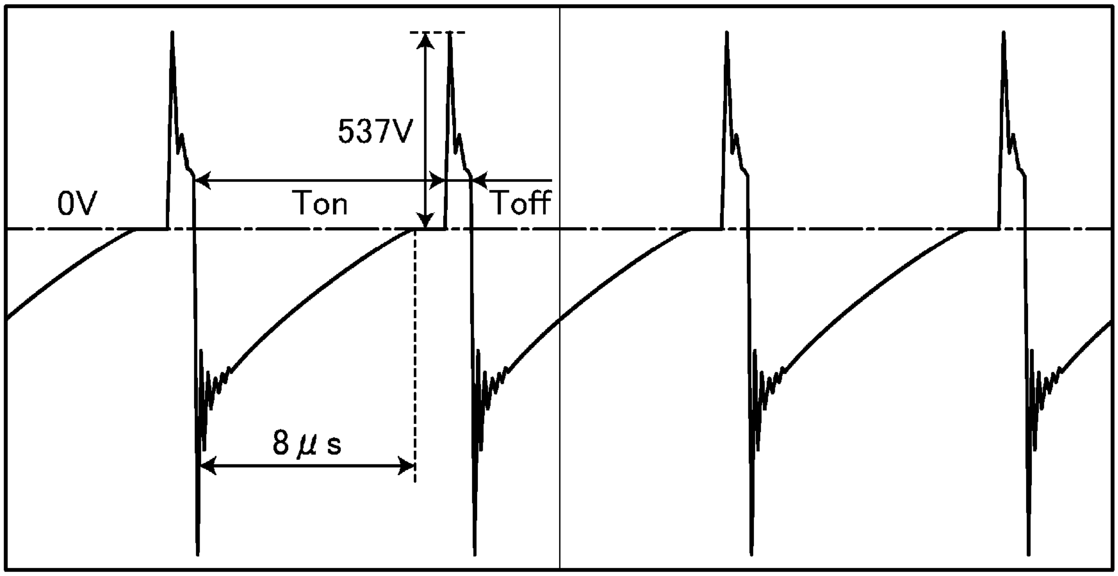
FIG. 9A is a diagram showing an example of a change in voltage of the substrate under maximum conditions.

FIG. 9A is a diagram showing an example of a change in voltage of the substrate W under the maximum conditions. FIG. 9A shows the actual change in voltage of the substrate W under the maximum conditions in the plasma processing apparatus 100. In FIG. 9A, the horizontal axis represents elapsed time and the vertical axis represents a voltage. Under the maximum conditions, as shown in FIG. 9A, the peak value of the positive voltage generated on the substrate W during the Off-period Toff is 537[V]. In addition, under the maximum conditions, it takes 8 sec for a voltage to reach an equilibrium state of zero during the On-period Ton.

Next, a change in voltage of the substrate W when some conditions are changed from the maximum conditions will be described.

Figure 9B:
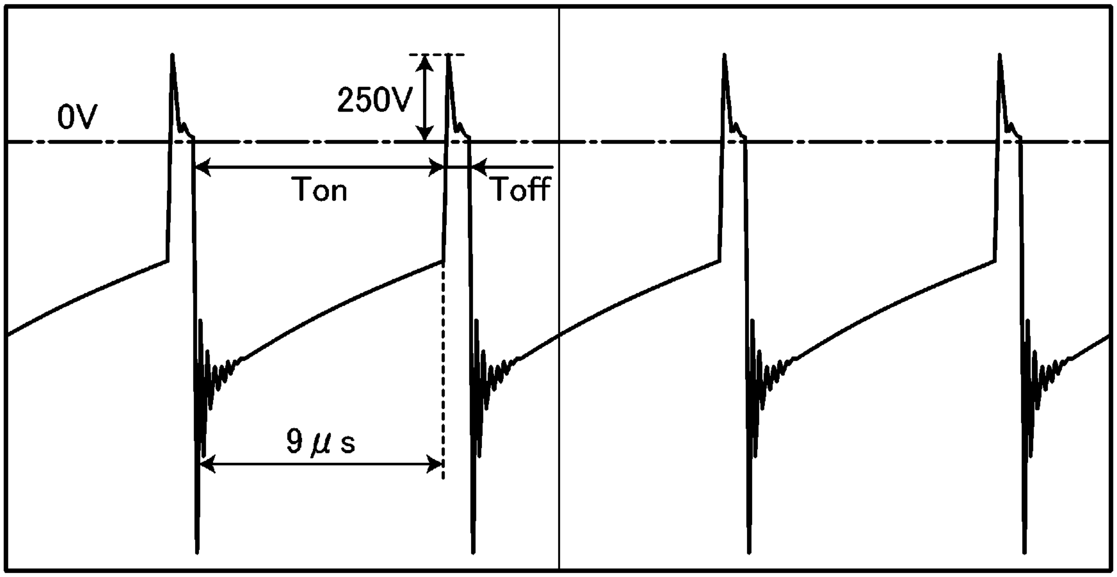
FIG. 9B is a diagram showing an example of a change in voltage of the substrate when the maximum conditions are partially changed.
Figure 9C:
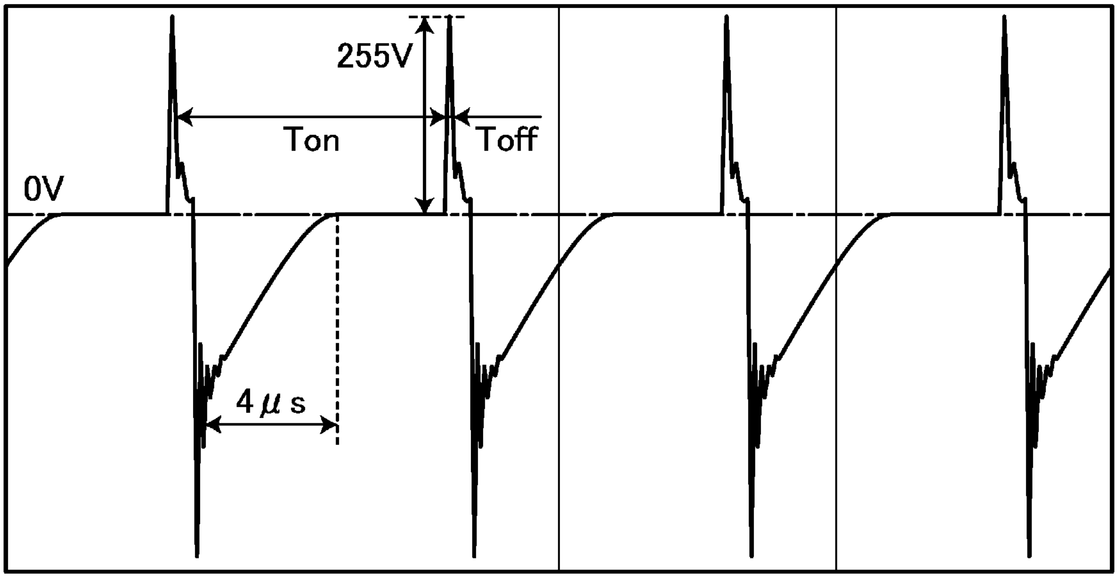
FIG. 9C is a diagram showing an example of a change in voltage of the substrate when the maximum conditions are partially changed.

FIGS. 9B and 9C are diagrams showing an example of a change in voltage of the substrate W when the maximum conditions are partially changed. FIG. 9B shows results of measurement when the gas species and flow rate of the processing gas under the above-mentioned maximum conditions are changed to Ar/$N_2$:150/5 [sccm]. FIG. 9C shows results of measurement when the DC voltage under the above-mentioned maximum conditions is changed to −400 [V]. As shown in FIG. 9B, when the gas species and flow rate of the processing gas are changed from the above-mentioned maximum conditions, the peak value of the positive voltage generated on the substrate W during the Off-period Toff is 250[V]. In addition, a voltage does not reach an equilibrium state of zero during the On-period Ton, and the On-period Ton is 9μ[sec]. In addition, as shown in FIG. 9C, when the DC voltage is changed from the above-mentioned maximum conditions to half, i.e., −400 [V], the peak value of the positive voltage generated on the substrate W during the Off-period Toff is 255[V]. In addition, it takes 4μ[sec] for the voltage to reach the equilibrium state of zero during the On-period Ton.

Next, a distance (gap) between the ceiling wall portion 111 and the stage 102 will be described. As described in FIGS. 6A to 6E, in the modification process according to the embodiment, the DC voltage is applied to the stage 102 to attract the positive ions from the plasma. In the plasma processing apparatus 100 according to the embodiment, when the gap between the ceiling wall portion 111 and the stage 102 is too small, the DC voltage applied to the stage 102 affects the plasma, making the plasma unstable. On the other hand, when the gap between the ceiling wall portion 111 and the stage 102 is too large, the positive ions may not be sufficiently attracted even when the DC voltage is applied to the stage 102. For this reason, it is preferable that the gap between the ceiling wall portion 111 and the stage 102 is 100 to 200 [mm].

Next, the plasma processing apparatus 100 according to the embodiment will be described in comparison with a parallel plate type plasma processing apparatus.

The plasma processing apparatus 100 according to the embodiment generates plasma using a microwave. The plasma processing apparatus 100 may generate plasma with low ion energy by using the microwave. In addition, the plasma processing apparatus 100 may stably generate plasma even in a high vacuum state with a relatively low pressure by using the microwave. In addition, the plasma processing apparatus 100 may generate high-density plasma by using the microwave.

On the other hand, the parallel plate type plasma processing apparatus generates plasma with high ion energy. Therefore, when a film formed on a substrate is modified by the parallel plate type plasma processing apparatus as in the embodiment, the damage of ions may be large, and etching of the film may progress.

In addition, in the parallel plate type plasma processing apparatus, in order to generate plasma, an RF voltage or a pulsed bias voltage is applied to an RF electrode configured to hold the substrate.

In contrast, the plasma processing apparatus 100 according to the embodiment generates plasma in the upper space of the processing container 101 by the microwave and periodically applies the pulsed DC voltage to the stage 102 to attract ions in the plasma into the substrate W.

Next, a case in which the DC voltage is periodically applied to the stage 102 will be described in comparison with a case in which a radio-frequency (RF) voltage is applied to the stage 102.

In the modification process according to the embodiment, the DC voltage is periodically applied to the stage 102 in a state where plasma is generated inside the processing container 101. As a result, the voltage of the substrate W is changed as shown in FIGS. 5B and 9A to 9C, and the substrate W may be temporarily made to have a positive voltage during the Off-period Toff to attract electrons to the substrate W.

Figure 10:
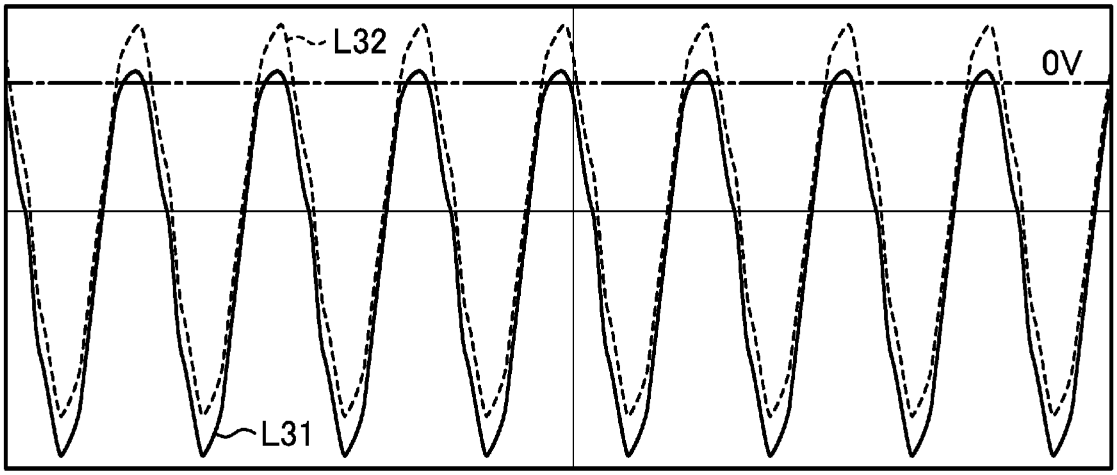
FIG. 10 is a diagram showing an example of a change in voltage of the substrate when a radio-frequency voltage is applied to a stage.

Here, for example, assume that the radio-frequency (RF) voltage is applied to the stage 102 instead of the DC voltage. FIG. 10 is a diagram showing an example of a change in voltage of the substrate W when the radio-frequency voltage is applied to the stage 102. In FIG. 10, the horizontal axis represents elapsed time and the vertical axis represents a voltage. FIG. 10 shows the waveform L31 of the radio-frequency voltage applied to the stage 102. The radio-frequency voltage is a sine wave based on a predetermined negative voltage and changes periodically. FIG. 10 also shows a waveform L32 of a change in voltage of the substrate W when the radio-frequency voltage is applied to the stage 102. The voltage of the substrate W changes in a sine wave shape in response to the radio-frequency voltage applied to the electrode 184.

When the negative voltage is applied to the stage 102 by the radio-frequency voltage, the substrate W has a negative voltage. Positive ions in plasma are attracted to the substrate W by this negative voltage. The radio-frequency voltage gradually changes as a sine wave, and the negative voltage does not disappear all at once as in the Off-period Toff. The voltage of the substrate W gradually changes in response to the radio-frequency voltage. The substrate W gradually releases the ions attracted when the voltage changes to the positive side. Therefore, the positive voltage of the substrate W becomes smaller. In this case, electrons in the plasma may not be sufficiently attracted to the substrate W.

Next, a difference in peak value of the positive voltage generated on the substrate W between when the DC voltage is periodically applied to the stage 102 and when the radio-frequency voltage is applied to the stage 102 will be described.

Figure 11A:
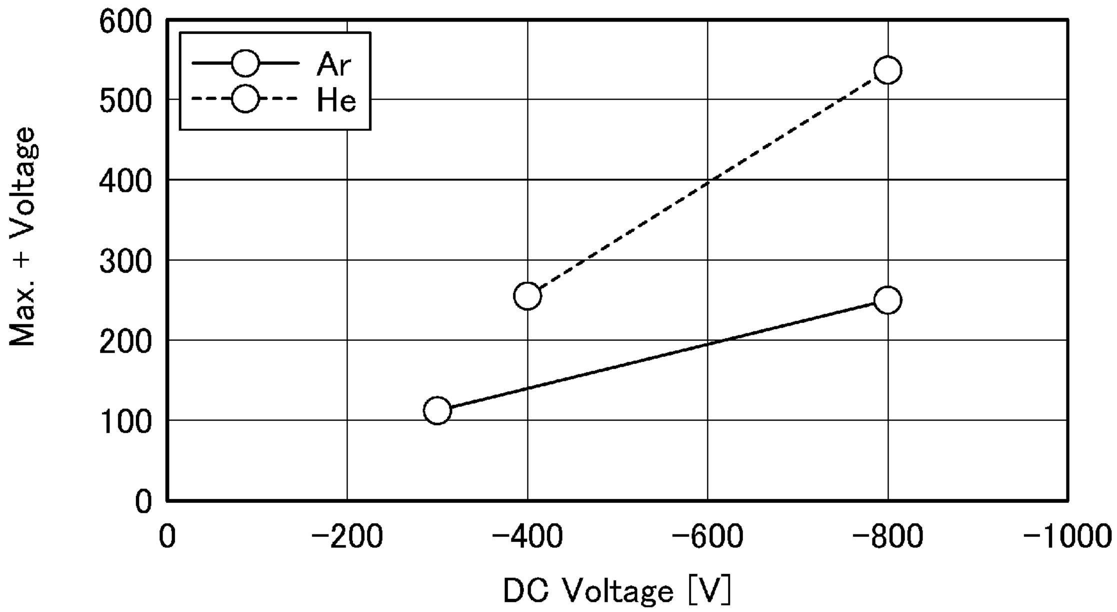
FIG. 11A is a diagram showing an example of a relationship between a DC voltage periodically applied to the stage and the peak value of the positive voltage generated on the substrate.
Figure 11B:
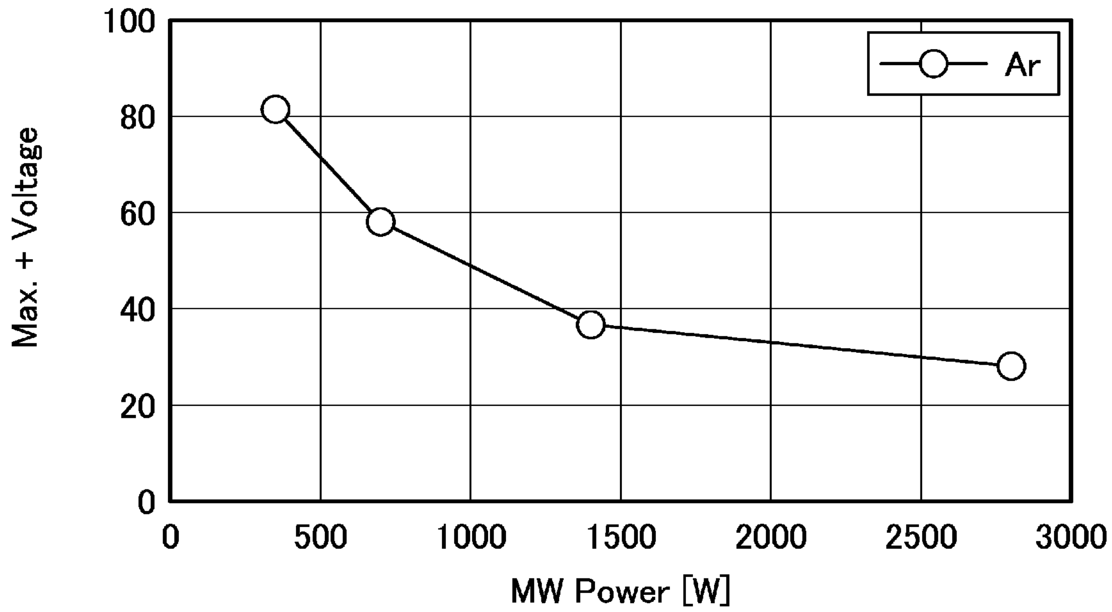
FIG. 11B is a diagram showing an example of a relationship between the DC voltage periodically applied to the stage and the peak value of the positive voltage generated on the substrate.
Figure 11C:
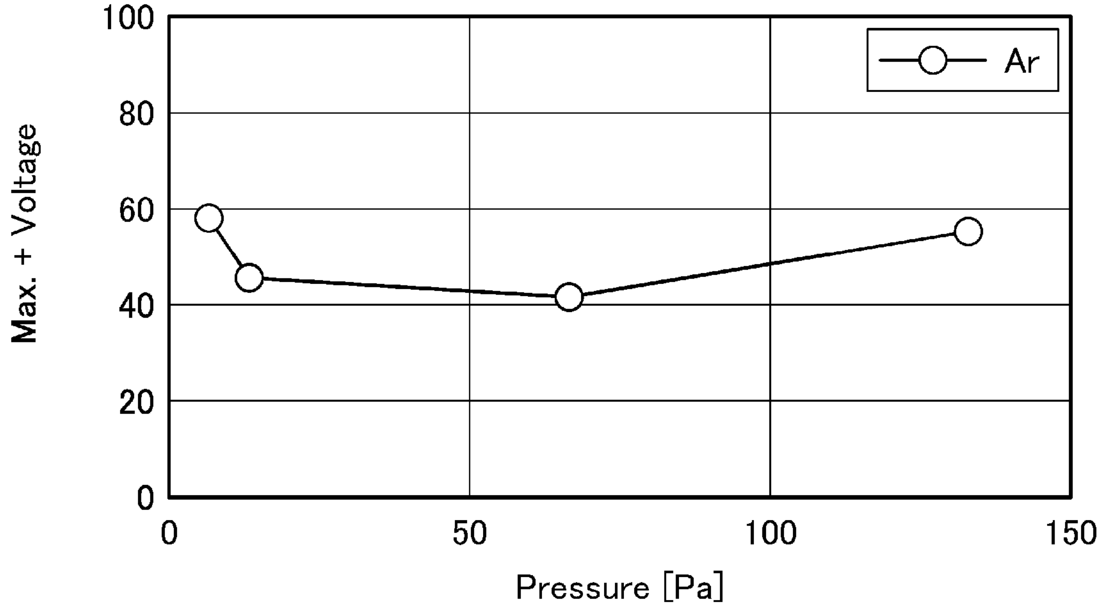
FIG. 11C is a diagram showing an example of a relationship between the DC voltage periodically applied to the stage and the peak value of the positive voltage generated on the substrate.

FIGS. 11A to 11C are diagrams showing an example of a relationship between the DC voltage periodically applied to the stage 102 and the peak value of the positive voltage generated on the substrate W. FIGS. 11A to 11C are based on the following base process conditions.

<Base Process Conditions>

Microwave power: 700 [W]

Internal pressure of processing container 101: 50 m[Torr] (6.6 [Pa])

DC voltage: −300[V]

Frequency at which DC voltage is applied: 100 k[Hz]

Proportion (duty ratio) of the period during which DC voltage is in ON state per cycle: 90%

FIG. 11A shows results of measuring the peak value of the positive voltage generated on the substrate W while changing the DC voltage from the base process conditions. FIG. 11B shows results of measuring the peak value of the positive voltage generated on the substrate W while changing the microwave power from the base process conditions. FIG. 11C shows results of measuring the peak value of the positive voltage generated on the substrate W by changing the internal pressure of the processing container 101 from the base process conditions.

FIG. 11A shows a graph of "Ar" and "He". FIGS. 11B and 11C show graphs of "Ar". The graph of "Ar" shows the results of measurement when the gas species and flow rate of the processing gas are $Ar/N_2$:300/20 [sccm]. The graph of "He" shows the results of measurement when the gas species and flow rate of the processing gas are $He/N_2$:300/20 [sccm].

Figure 12A:
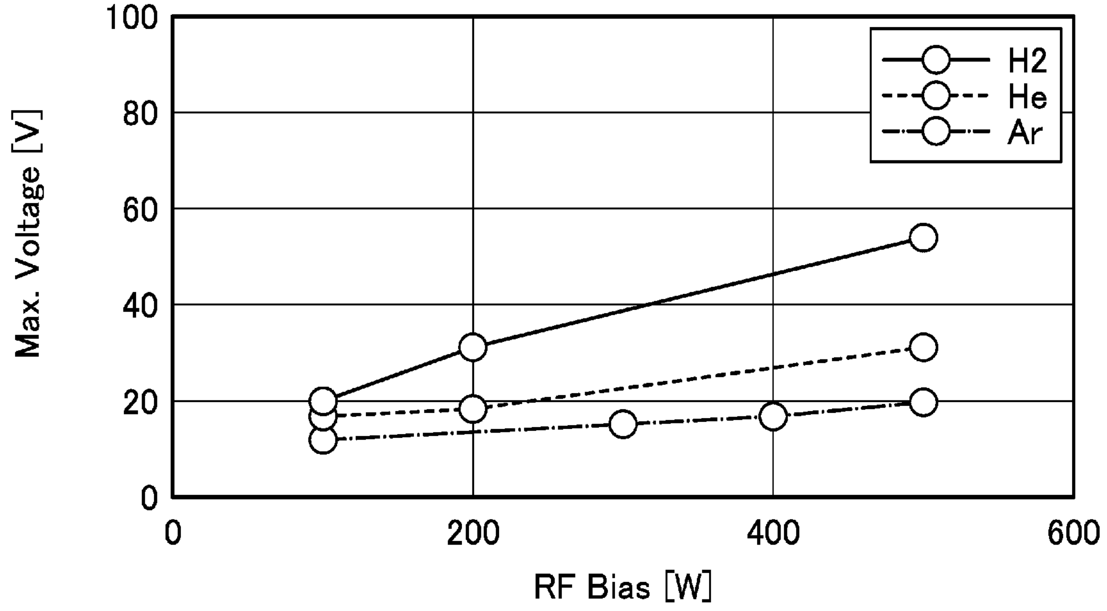
FIG. 12A is a diagram showing an example of a relationship between a radio-frequency voltage applied to the stage and the peak value of the positive voltage generated on the substrate.
Figure 12B:
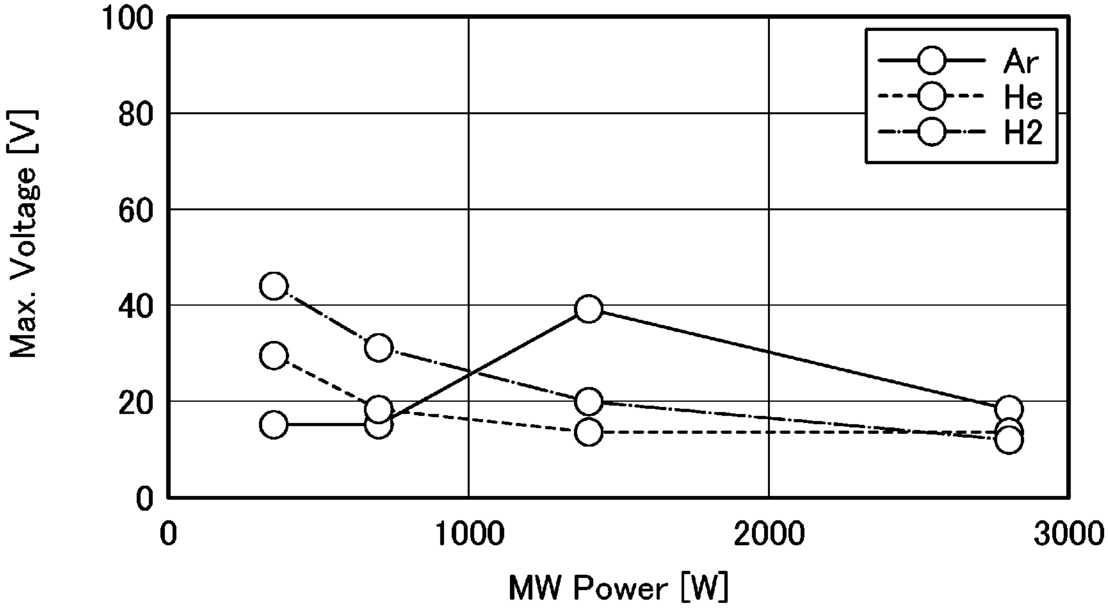
FIG. 12B is a diagram showing an example of a relationship between the radio-frequency voltage applied to the stage and the peak value of the positive voltage generated on the substrate.
Figure 12C:
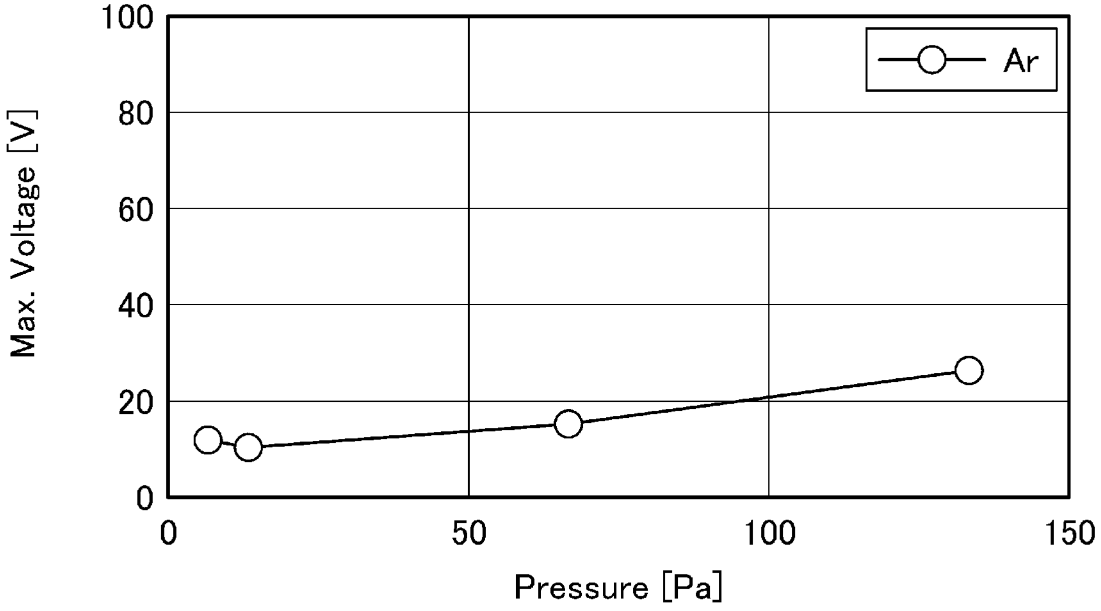
FIG. 12C is a diagram showing an example of a relationship between the radio-frequency voltage applied to the stage and the peak value of the positive voltage generated on the substrate.

FIGS. 12A to 12C are diagrams showing an example of a relationship between the radio-frequency voltage applied to the stage 102 and the peak value of the positive voltage generated on the substrate W. FIGS. 12A to 12C show results of measurement based on the above-mentioned base process conditions of "DC voltage: −300[V]" changed to "radio-frequency voltage: 200 [W]".

FIG. 12A shows results of measuring the peak value of the positive voltage generated in the substrate W while changing the radio-frequency power from the base process conditions. FIG. 12B shows results of measuring the peak value of the positive voltage generated on the substrate W while changing the microwave power from the base process conditions. FIG. 12C shows results of measuring the peak value of the positive voltage generated on the substrate W while changing the internal pressure of the processing container 101 from the base process conditions.

FIGS. 12A and 12B show graphs of "Ar", "He", and "$H_2$". FIG. 12C shows a graph of "Ar". The graph of "Ar" is the results of measurement when the gas species and flow rate of the processing gas are $Ar/N_2$:300/20 [sccm]. The graph of "He" is the results of measurement when the gas species and flow rate of the processing gas are $He/N_2$:300/20 [sccm]. The graph of "H2" is the results of measurement when the gas species and flow rate of the processing gas are $H_2/N_2$: 300/20 [sccm].

Comparing FIG. 11A with FIG. 12A, FIG. 11B with FIG. 12B, and FIG. 11C with FIG. 12C, the peak value of the positive voltage generated on the substrate W is higher in FIG. 11A to FIG. 11C. Therefore, applying the DC voltage periodically to the stage 102 is more effective for attracting electrons in the plasma to the substrate W.

Figures 13, 14A:
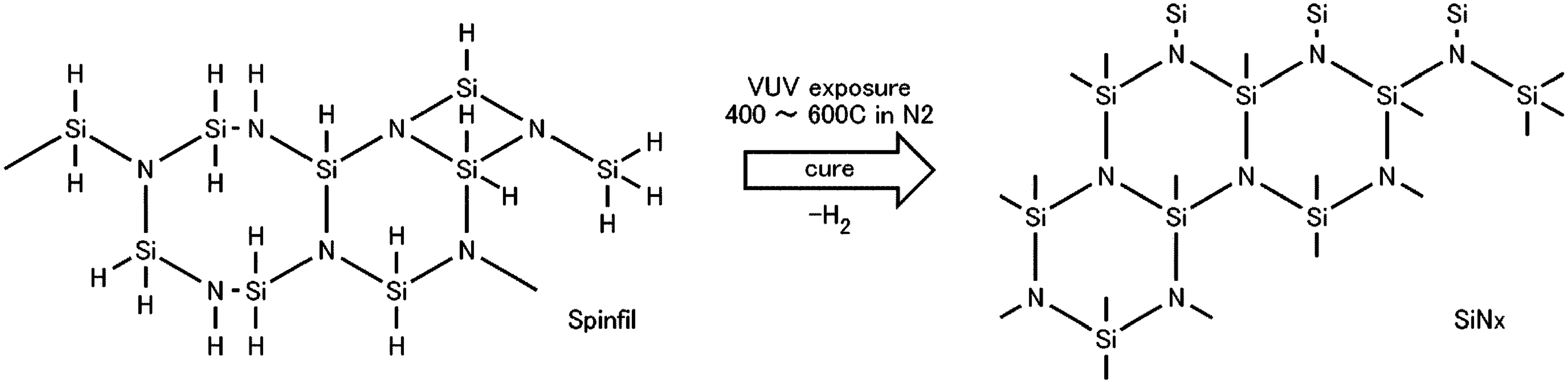
FIG. 13 is a view showing a chemical structure of a film.
FIG. 14A is a diagram for explaining contents of an experiment.

Next, an example of results of an experiment in which the modification process is performed will be described. The substrate W is a silicon wafer, and a SINx film is coated by spin coating. The SINx film is formed by, for example, spin coating Spinfil (registered trademark). FIG. 13 is a view showing a chemical structure of the film. Spinfil (registered trademark) contains H in its chemical structure, but may form the SINx film by exposing it to VUV (Vacuum Ultra Violet).

In the experiment, an electron process of irradiating the substrate W with an electron beam by the modification process according to the embodiment is performed on the substrate W on which the SINx film has been formed. In addition, in the experiment, an annealing process and a VUV process are performed before or after the modification process for comparison.

FIG. 14A is a diagram for explaining contents of the experiment. In the experiment, six patterns of Split 1 to 6 are performed and compared with each other. FIG. 14A shows the contents and order of the processes performed in Split 1 to 6. The "order" shown after annealing, electron process, and VUV process indicates the order of the processes in Split 1 to 6. Processes with blank "order" are not performed. For example, Split 1 only performs the electron process. Split 2 performs the annealing after the electron process. Split 3 performs the electron process after the annealing. Split 4 performs the VUV process after the electron process.

In the annealing, the substrate W is exposed to an $N_2$ gas in an atmosphere of 450 degrees C. for 30 minutes. In the electron process, the substrate W is irradiated with the electron beam for 10 minutes by the modification process according to the embodiment. In the "maximum conditions-10 min" of Split 1 to 4, the modification process is performed for 10 minutes under the above-mentioned maximum conditions. Under the above-mentioned maximum conditions, for example, as shown in FIG. 9A, the peak value of the positive voltage generated on the substrate W during the Off-period Toff is 537[V]. In the "gas species swing" of Split 5, the gas species and flow rate of the processing gas under the above-mentioned maximum condition are changed to $Ar/N_2$:150/5 [sccm] and the modification process is performed for 10 minutes. In the "gas species swing", for example, as shown in FIG. 9B, the peak value of the positive voltage generated on the substrate W during the Off-period Toff is 250[V]. In the "DC bias swing" of Split 6, the DC voltage under the above-mentioned maximum conditions is changed to −400[V] and the modification process is performed for 10 minutes. In the "DC bias swing", for example, as shown in FIG. 9C, the peak value of the positive voltage generated on the substrate W during the Off-period Toff is 255[V].

FIG. 14B is a diagram for explaining results of the experiment. In FIG. 14B, the results of measurement are shown in rows divided into "1" to "6" for the substrates W of Split 1 to 6 on which the experiment has been performed. For example, "1" is the measurement results for the substrate W of Split 1. "6" is the measurement results for the substrate W of Split 6. Thickness is the measurement results of the film thickness. RI is the measurement results of the refractive index. FT-IR is the measurement results of bonds of Si—H, Si—O, and O/H contained in the film by Fourier transform infrared spectroscopy. Leakage is the measurement results of the leakage current. XPS is the measurement results of XPS (X-ray Photoelectron Spectroscopy), showing the O (oxygen) concentration (O conc).

In addition, FIG. 14B shows comparative examples 1 and 2. Comparative example 1 is the measurement results for the substrate W coated with Spinfil (registered trademark) by spin coating and then heated at 80 degrees C. to fly a solution off. After the spin coating, the substrate W is usually heat-treated to stabilize the film. Comparative example 2 is the measurement results for the substrate W coated with Spinfil (registered trademark) by the spin coating and then heat-treated at 450 degrees C. O is introduced into the spin-coated film by heat treatment or air exposure. In comparative example 2, the O concentration of the film is high due to the heat treatment and the air exposure.

On the other hand, as shown in "1" (Split 1), when the substrate W coated with a film by the spin coating is irradiated with an electron beam for 10 minutes by the modification process according to the embodiment, the O concentration may be suppressed to a low level. The reason for this is thought to be that the film composed of Si, N, and H may be modified to SiN before O is introduced into the film by the air exposure or the heat treatment.

In addition, as shown in "2" (Split 2) and "3" (Split 3), the concentration of O may be suppressed to a low level by irradiating the substrate W with an electron beam by the modification process according to the embodiment before or after the heat treatment. In addition, as shown in "4" (Split 4), the concentration of O may also be suppressed to a low level by irradiating the substrate W with an electron beam by the modification process according to the embodiment before the VUV process. The reason for this is thought to be that the film is modified to SiN before O is introduced into the film due to the air exposure.

As shown in "5" (Split 5) and "6" (Split 6), the concentration of O may be suppressed to a low level even when the peak value of the positive voltage generated on the substrate W during the Off-period Toff is reduced by performing the modification process according to the embodiment with the "gas species swing" or the "DC bias swing".

Figure 15A:
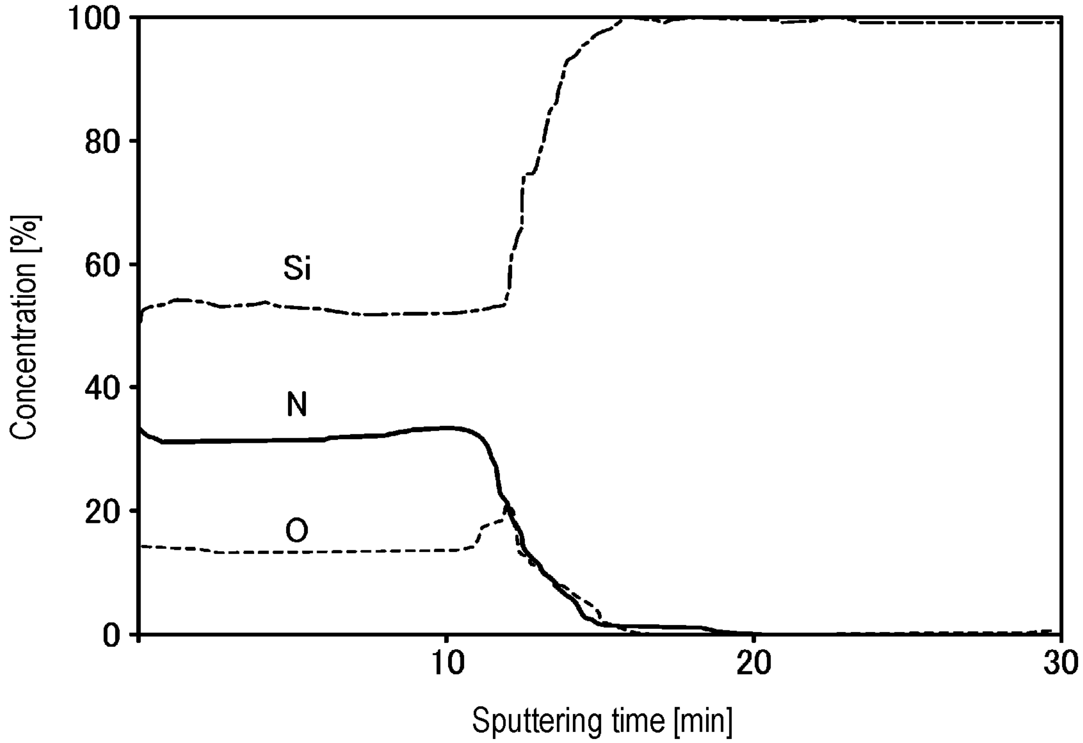
FIG. 15A is a diagram for explaining components included in the substrate.
Figure 15B:
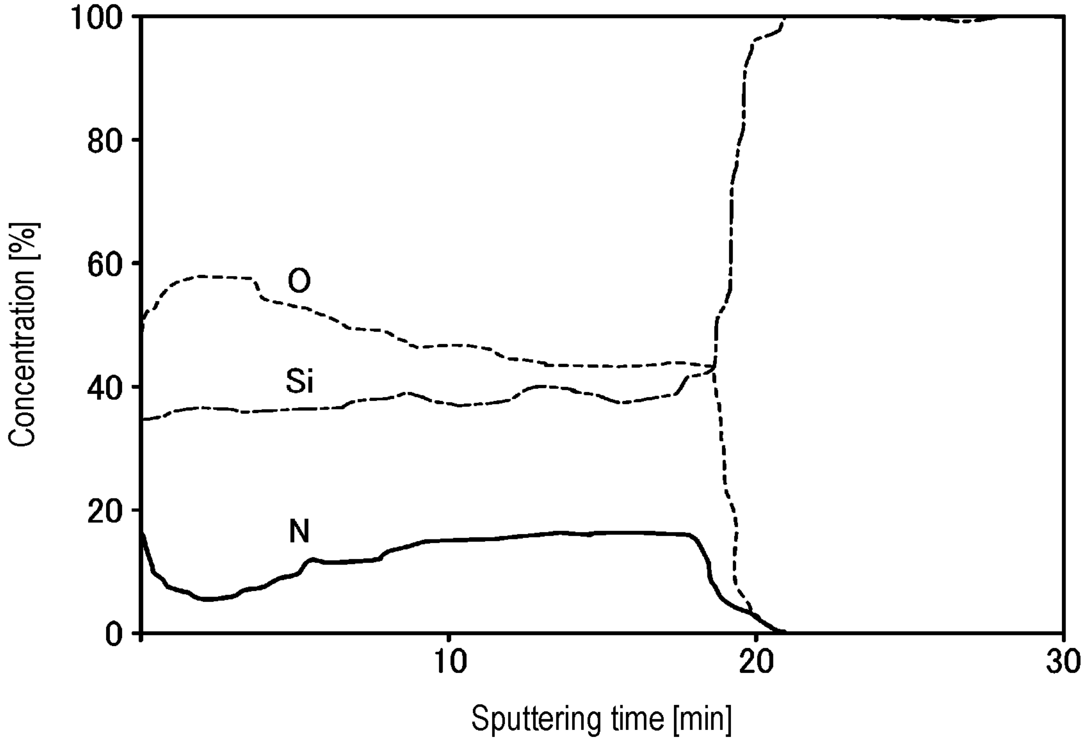
FIG. 15B is a diagram for explaining components included in the substrate.
Figure 15C:
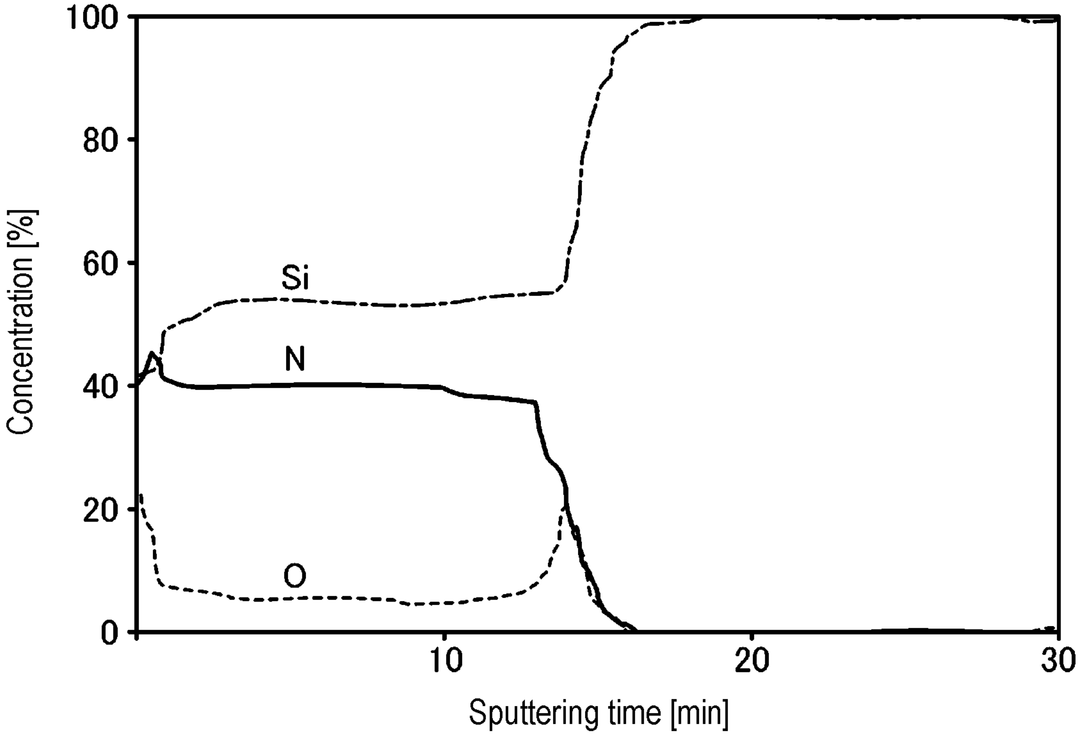
FIG. 15C is a diagram for explaining components included in the substrate.

Next, results of analyzing the components contained in the substrate W will be described. FIGS. 15A to 15C are diagrams for explaining components contained in the substrate W. FIGS. 15A to 15C are graphs showing a sputtering time (processing time) when the substrate W is scrapped from the surface side by performing sputtering on the substrate W on which a film is formed, and the concentrations of the components Si, N, and O measured during the sputtering. The sputtering time corresponds to a depth of the film from the surface. The state in which the components are almost Si is a state in which the components reach the silicon wafer underlying the film. FIG. 15A shows measurement results for the substrate W of Comparative example 1. FIG. 15B shows measurement results for the substrate W of Comparative example 2. FIG. 15C shows the measurement results for the substrate W of Split 1, showing the results of modification by the modification process according to the embodiment. Since the thickness and hardness of the film are different, the time until the components are almost Si is different in FIGS. 15A to 15C.

As shown in FIG. 15A, the substrate W of Comparative example 1 contains O of a certain concentration. As shown in FIG. 15B, in the substrate W of Comparative example 2, the concentration of O is higher than that in Comparative example 1 due to the heat treatment and the air exposure.

On the other hand, as shown in FIG. 15C, the increase of O in the substrate W of Split 1 is suppressed as compared to Comparative example 1. In addition, since there is no increase of O in the depth direction in the substrate W of Split 1, the substrate W is modified in the depth direction as well.

Here, in the modification process according to the embodiment, ions and radicals are also irradiated onto the substrate W. However, modification caused by the ions and radicals is limited to a few nm from the surface of the film. In the modification process according to the embodiment, the film may be modified up to about 100 nm from the surface by irradiating the film with an electron beam.

[Modification Method]

Figure 16:
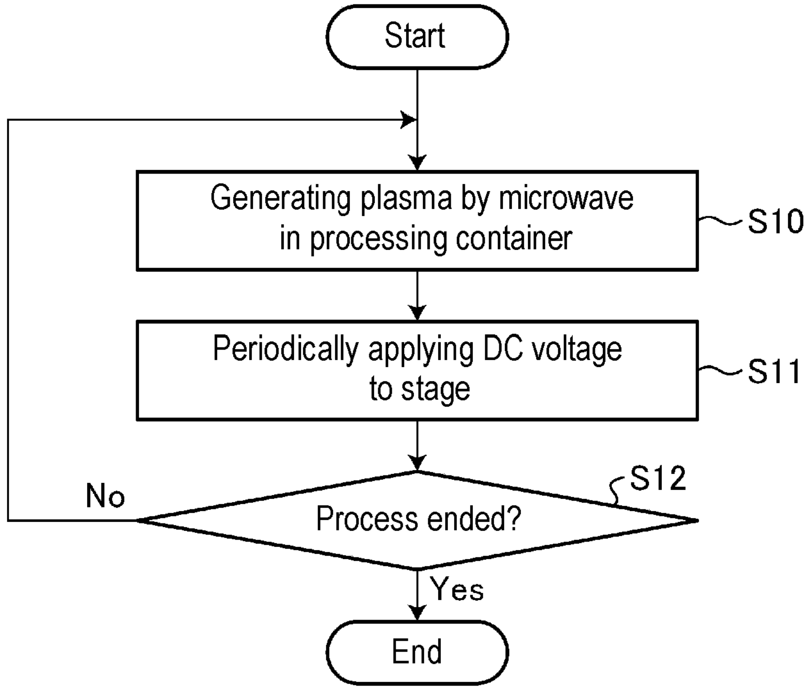
FIG. 16 is a flowchart showing an example of a flow of a modification method according to an embodiment.

Next, a flow of the modification process by a modification method according to an embodiment will be described. FIG. 16 is a flowchart showing an example of the flow of the modification process by the modification method according to the embodiment. In the plasma processing apparatus 100, the substrate W on which a film is formed is placed on the stage 102.

The plasma processing apparatus 100 generates plasma by a microwave inside the processing container 101 (step S10). For example, the controller 200 controls the gas supplier 127 and the microwave introduction device 105 to supply the processing gas used for modification from the gas supplier 127 into the processing container 101 while introducing the microwave from the microwave introduction device 105 into the processing container 101 to generate plasma.

The plasma processing apparatus 100 periodically applies the DC voltage to the stage 102 inside the processing container 101 in which the plasma is generated, and irradiates the substrate W with electrons in the plasma (step S11). For example, the controller 200 controls the DC power supply 122 to periodically apply the DC voltage from the DC power supply 122 to the stage 102, and irradiates the substrate W with electrons in the plasma.

The plasma processing apparatus 100 determines whether or not the process is ended (step S12). For example, the controller 200 determines whether or not a predetermined processing time has elapsed since the start of the modification process. When it is determined that the predetermined processing time has elapsed, the process ends (Yes in step S12). On the other hand, when it is determined that the predetermined processing time have not elapsed (No in step S12), the process proceeds to step S10 and continues.

As a result, the modification process by the modification method according to the embodiment may selectively modify an upper film while suppressing damage to a lower film.

In the above-described embodiment, the case in which the DC power supply 122 periodically applies the negative voltage to the electrode 184 of the stage 102 to change the voltage of the electrode 184 to two levels of a negative voltage and a zero voltage has been described as an example. However, the present disclosure is not limited thereto. The DC power supply 122 may periodically apply DC voltages of two different voltage levels alternately to the electrode 184 of the stage 102. As long as a positive voltage may be generated at the electrode 184, the two voltage levels may be both negative voltages, may be a negative voltage and a positive voltage, or may be a positive voltage and a zero voltage. For example, the DC power supply 122 may alternately and periodically apply the DC voltage of −800V and the DC voltage of −50V to the electrode 184 of the stage 102. When the DC voltage of −800V is applied to the electrode 184, positive ions in the plasma are attracted to the substrate W. Then, when the voltage applied to the electrode 184 is switched from −800V to −50V, the substrate W swings to the positive side due to the influence of the positive charges of the attracted ions. In addition, for example, the DC power supply 122 may alternately and periodically apply the DC voltage of −800V and the DC voltage of +50V to the electrode 184 of the stage 102. Even in this case, by switching the voltage applied to the electrode 184 from −800V to +50V, the substrate W swings to the positive side due to the influence of the positive charges of the attracted ions. In addition, for example, the DC power supply 122 may alternately and periodically apply a DC voltage of +800V and a zero voltage to the electrode 184 of the stage 102. In this case, when the DC voltage of +800V is applied to the electrode 184, the voltage becomes positive to attract electrons in the plasma to the substrate W, so that the film formed on the substrate W may be modified by the attracted electrons.

As described above, the modification method according to the embodiment is a method of modifying a film formed on the substrate W. The modification method includes a generation operation (step S10) and an irradiation operation (step S11). In the generation operation, plasma is generated by a microwave inside the processing container 101 in which the stage 102 on which the substrate W is placed is provided. In the irradiation operation, a DC voltage is periodically applied to the stage 102 inside the processing container 101 in which the plasma is generated in the generation operation, and electrons in the plasma are irradiated onto the substrate W. As a result, the modification method according to the embodiment may selectively modify an upper film while suppressing damage to a lower film.

In addition, in the irradiation operation, DC voltages of two different voltage levels are alternately and periodically applied. As a result, the modification method according to the embodiment may generate a positive voltage with a higher peak value in the substrate as compared to a case in which a radio-frequency (RF) voltage is applied to the stage 102.

In addition, in the irradiation operation, a negative DC voltage is periodically applied. As a result, the modification method according to the embodiment may temporarily generate a positive voltage in the substrate W during the Off-period Toff in which the negative DC voltage is in OFF state, and may attract electrons to the substrate W.

In addition, the stage 102 is formed of a dielectric material and includes the electrode 184 to which the DC voltage is applied. As a result, the modification method according to the embodiment may generate a positive voltage on the substrate W.

The frequency at which the DC voltage is applied is 200 kHz or less. The proportion of the period during which the DC voltage is in ON state per cycle is 80% or more. As a result, the modification method according to the embodiment may generate a positive voltage with a high peak value on the substrate.

In addition, the period during which the DC voltage is in ON state per cycle during which the DC voltage is applied periodically is set to 4 to 10μ[sec]. As a result, the modification method according to the embodiment may generate a positive voltage with a high peak value on the substrate while suppressing a decrease in productivity.

In addition, in the generation operation, the power of the microwave generating plasma in the processing container 101 is 175 to 1,500 [W], the internal pressure of the processing container 101 is 2 to 100 [Pa], and the gas species of the processing gas supplied to the processing container 101 are He and $N_2$. In the irradiation operation, the DC voltage periodically applied is −400 [V] or less. As a result, the modification method according to the embodiment may generate a positive voltage with a high peak value on the substrate.

In addition, the processing container 101 includes an irradiator (the microwave introduction device 105) which irradiates with the microwave and is provided on the ceiling wall portion 111 of the processing container 101. The gap between the ceiling wall portion 111 and the stage 102 is set to 100 to 200 mm. As a result, the modification method according to the embodiment may stably generate a positive voltage on the substrate.

According to the present disclosure in some embodiments, it is possible to selectively modify an upper film while minimizing damage to a lower film.

Although the embodiments have been described above, the embodiments disclosed herein should be considered to be illustrative and not restrictive in all respects. Indeed, the above-described embodiments may be embodied in various forms. Further, the above-described embodiments may be omitted, substituted, or modified in various forms without departing from the scope and spirit of the claims.

For example, in the above-described embodiments, the case in which the substrate W is a semiconductor wafer has been described as an example, but the present disclosure is not limited thereto. The substrate W may be any type of substrate.

What is claimed is:

1. A method of modifying a film formed on a substrate, the method comprising:

generating plasma by a microwave in an interior of a processing container in which a stage on which a substrate is placed is provided; and periodically applying a DC voltage to the stage in the interior of the processing container in which the plasma is generated by the generating the plasma, and irradiating the substrate with electrons in the plasma, wherein in the generating the plasma, a gas species of a processing gas supplied to the interior of the processing container is He and $N_2$, and a flow rate ratio of $N_2$ to He is 9% or less.

2. The method of claim 1, wherein the irradiating the substrate includes periodically applying DC voltages of two different voltage levels.

3. The method of claim 1, wherein the irradiating the substrate includes periodically applying a negative DC voltage.

4. The method of claim 1, wherein the stage is formed of a dielectric material and includes an electrode provided in the stage, the DC voltage being applied to the electrode.

5. The method of claim 1, wherein a frequency when the DC voltage is applied is 200 kHz or less, and a proportion of a period during which the DC voltage is in an ON state in each cycle is 80% or more.

6. The method of claim 1, wherein a period during which the DC voltage is in an ON state in each cycle during which the DC voltage is periodically applied is set to 4 to 10μ[sec].

7. The method of claim 1, wherein in the generating the plasma, power of the microwave for generating the plasma in the interior of the processing container is 175 to 1500 [W], an internal pressure of the processing container is 2 to 100 [Pa], and wherein in the irradiating the substrate, the DC voltage which is periodically applied to the stage is −400 [V] or less.

8. The method of claim 1, wherein the processing container includes an irradiator provided on a ceiling wall portion of the processing container to irradiate with the microwave, and wherein a gap between the ceiling wall portion and the stage is 100 to 200 mm.

9. A modification device comprising:

a processing container including a stage provided in an interior of the processing container, wherein a substrate on which a film to be modified is formed is placed on the stage;

a generator configured to generate plasma by a microwave in the interior of the processing container;

a voltage applier configured to apply a DC voltage to the stage; and a controller configured to control the voltage applier to periodically apply a DC voltage to the stage while controlling the generator to generate the plasma in the interior of the processing container, wherein in the generating the plasma, a gas species of a processing gas supplied to the interior of the processing container is He and $N_2$, and a flow rate ratio of $N_2$ to He is 9% or less.

* * * * *